(12) United States Patent
Kobayashi et al.

(10) Patent No.: US 9,137,890 B2
(45) Date of Patent: Sep. 15, 2015

(54) WIRING BOARD AND LIGHT EMITTING DEVICE

(71) Applicant: SHINKO ELECTRIC INDUSTRIES CO., LTD., Nagano-shi, Nagano (JP)

(72) Inventors: Kazutaka Kobayashi, Nagano (JP); Mitsuhiro Aizawa, Nagano (JP); Hiroshi Shimizu, Nagano (JP); Mina Iwai, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 32 days.

(21) Appl. No.: 14/177,599

(22) Filed: Feb. 11, 2014

(65) Prior Publication Data

US 2014/0226346 A1    Aug. 14, 2014

(30) Foreign Application Priority Data

Feb. 12, 2013    (JP) .................. 2013-024706

(51) Int. Cl.
*H05K 1/16* (2006.01)
*H05K 7/10* (2006.01)
*H05K 1/02* (2006.01)
(Continued)

(52) U.S. Cl.
CPC .............. *H05K 1/0274* (2013.01); *H01L 33/60* (2013.01); *H01L 33/62* (2013.01); *H05K 3/243* (2013.01); *H05K 3/26* (2013.01); *H05K 3/285* (2013.01); *H01L 25/0753* (2013.01); *H01L 2224/45144* (2013.01); *H01L 2224/48091* (2013.01); *H01L 2224/48137* (2013.01); *H01L 2224/73265* (2013.01); *H01L 2924/19107* (2013.01); *H05K 3/007* (2013.01); *H05K 3/06* (2013.01); *H05K 3/187* (2013.01); *H05K 3/287* (2013.01); *H05K 3/303* (2013.01); *H05K 2201/0162* (2013.01); *H05K 2201/09881* (2013.01); *H05K 2201/10106* (2013.01); *H05K 2201/10553* (2013.01); *H05K 2201/2054* (2013.01); *H05K 2203/0126* (2013.01); *H05K 2203/0191* (2013.01); *H05K 2203/0285* (2013.01); *H05K 2203/0369* (2013.01); *H05K 2203/075* (2013.01);
(Continued)

(58) Field of Classification Search
CPC .................. H01L 21/02142; H01L 21/02156; H01L 21/02172; H01L 29/517; H01L 2924/14; H01L 2924/16; H01L 24/81; H05K 2201/10734; H05K 2201/10689; H05K 1/11; H05K 1/112; H05K 1/141
USPC .......... 174/250, 255–257, 260–262; 361/760, 361/767, 771, 777, 779, 783
See application file for complete search history.

(56) References Cited

U.S. PATENT DOCUMENTS

2002/0167084 A1* 11/2002 Coccioli et al. ............... 257/732
2006/0225918 A1* 10/2006 Chinda et al. ................. 174/260
(Continued)

FOREIGN PATENT DOCUMENTS

JP    2012-049229 A    3/2012

*Primary Examiner* — Hoa C Nguyen
(74) *Attorney, Agent, or Firm* — Drinker Biddle & Reath LLP

(57) ABSTRACT

There is provided a wiring board. The wiring board includes: a first insulating layer; a plurality of wiring patterns on the first insulating layer so as to be spaced apart from each other; a plating layer on at least one of the wiring patterns; a second insulating layer containing silicone therein and having an opening, wherein an outermost surface of the plating layer is exposed from the opening and serves as a connection pad; and a silica film on the outermost surface of the plating layer.

8 Claims, 15 Drawing Sheets

(51) Int. Cl.
*H01L 33/60* (2010.01)
*H01L 33/62* (2010.01)
*H05K 3/24* (2006.01)
*H05K 3/26* (2006.01)
*H05K 3/28* (2006.01)
*H01L 25/075* (2006.01)
*H05K 3/00* (2006.01)
*H05K 3/06* (2006.01)
*H05K 3/18* (2006.01)
*H05K 3/30* (2006.01)

(52) U.S. Cl.
CPC .... *H05K2203/087* (2013.01); *H05K 2203/095* (2013.01); *H05K 2203/107* (2013.01)

(56) References Cited

U.S. PATENT DOCUMENTS

| | | | | |
|---|---|---|---|---|
| 2007/0268675 | A1* | 11/2007 | Chinda et al. | 361/748 |
| 2007/0292993 | A1* | 12/2007 | Tanoue | 438/123 |
| 2008/0136033 | A1* | 6/2008 | Nagamatsu et al. | 257/758 |
| 2010/0012360 | A1* | 1/2010 | Takahashi et al. | 174/257 |
| 2013/0099273 | A1* | 4/2013 | Shimizu et al. | 257/99 |

* cited by examiner

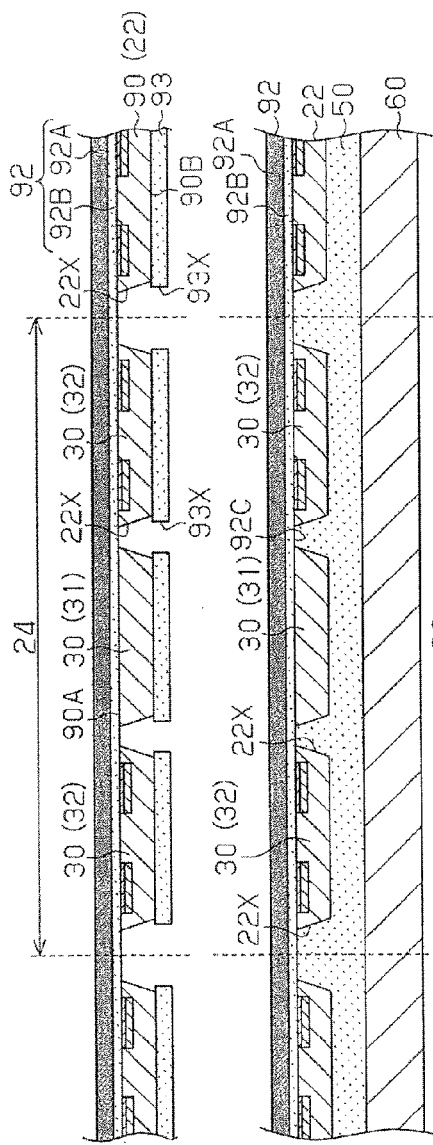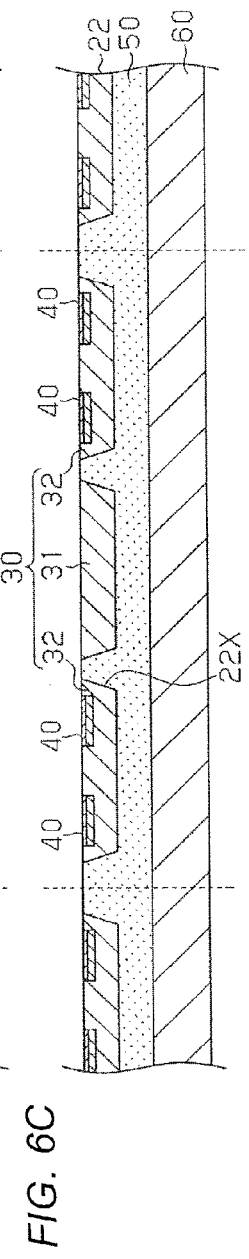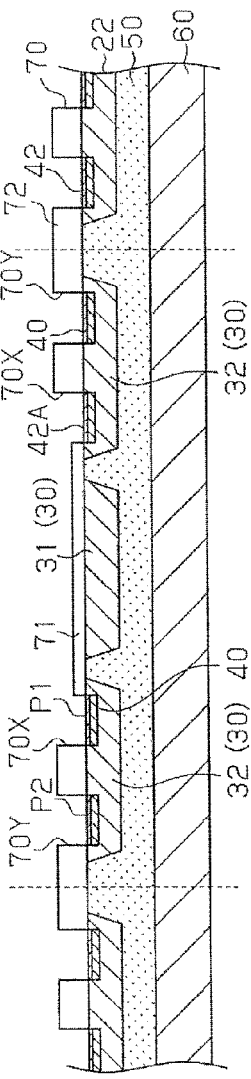
FIG. 6A
FIG. 6B
FIG. 6C
FIG. 6D

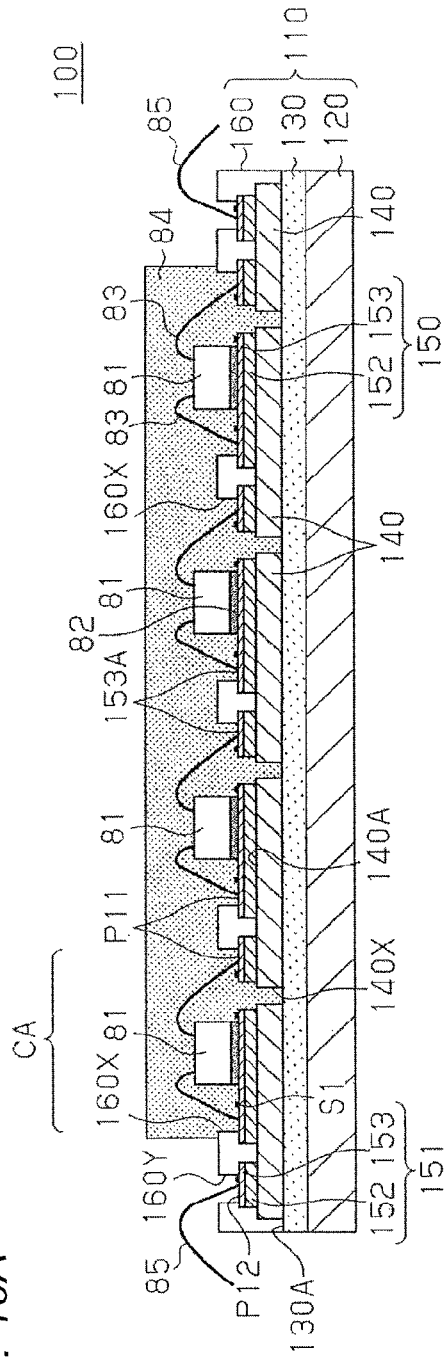
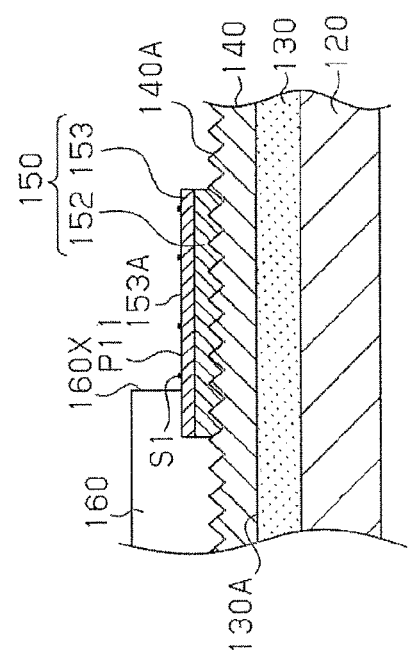
FIG. 10A
FIG. 10B

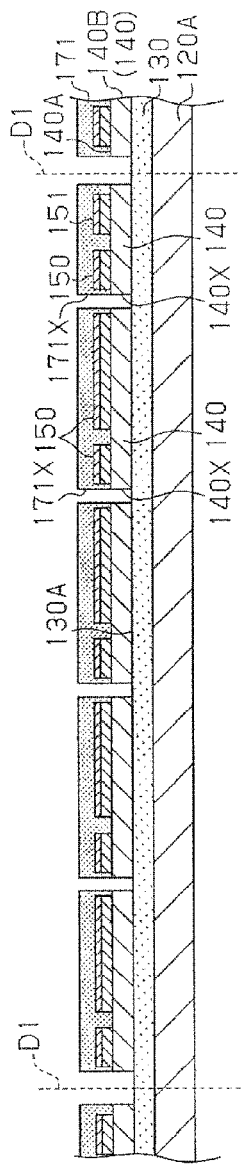
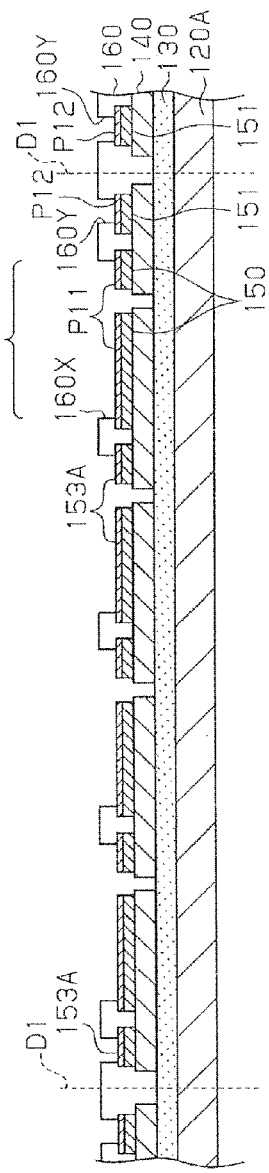
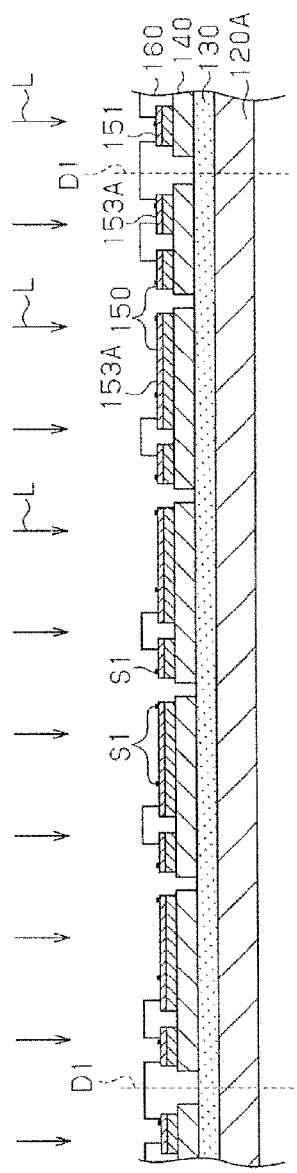
FIG. 14A
FIG. 14B
FIG. 14C

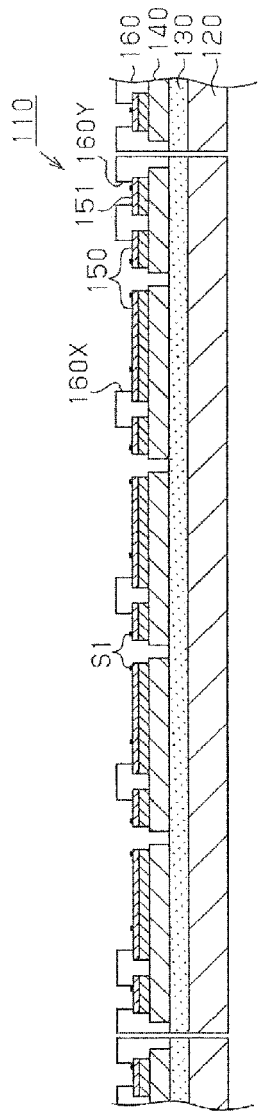
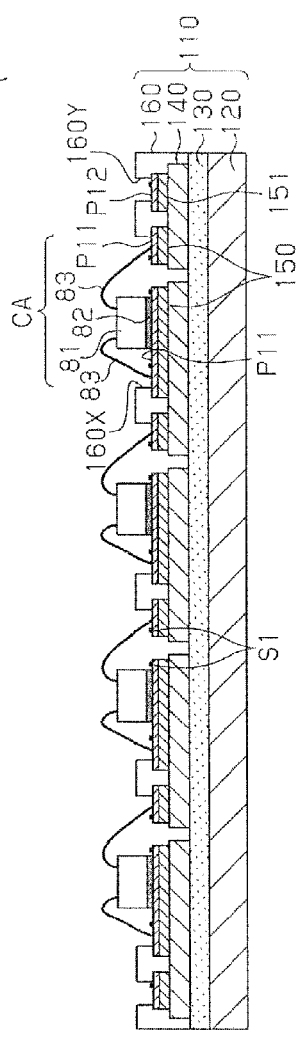
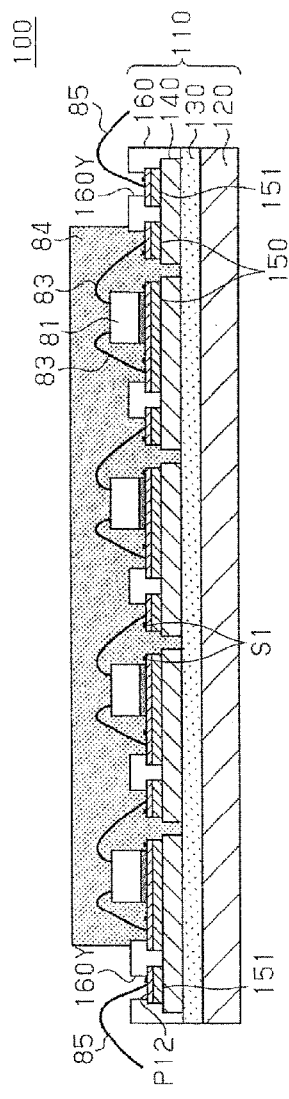
FIG. 15A
FIG. 15B
FIG. 15C

| No. | IRRADIATION AMOUNT (mJ/cm²) | ESCA ANALYSIS RESULT (RELATIVE ATOMIC WEIGHT) | | | WB STRENGTH (N) |
|---|---|---|---|---|---|
| | | Si | | Au | |
| | | SiO₂ | Si-O | | |
| 1 | 0 | 10.4 | 1.5 | 100 | 0.11 |
| 2 | 520 | 12.5 | 0.9 | 100 | 0.14 |
| 3 | 1300 | 10.8 | 0.3 | 100 | 0.16 |
| 4 | 2340 | 15.4 | UNDETECTED | 100 | 0.19 |
| 5 | 3900 | 14.6 | UNDETECTED | 100 | 0.19 |

WIRING BOARD AND LIGHT EMITTING DEVICE

This application claims priority from Japanese Patent Application No. 2013-024706, filed on Feb. 12, 2013, the entire contents of which are herein incorporated by reference.

BACKGROUND OF THE INVENTION

1. Technical Field

The present disclosure relates to a wiring board and a light emitting device.

2. Description of the Related Art

In recent years, a light emitting diode (LED), which has low power consumption and a long life, has attracted attention as a light source, and, for example, an LED module on which a plurality of LEDs are mounted has been proposed (see JP-A-2012-49229, for example). An insulating layer, which reflects light emitted from the LEDs, is formed on the outermost layer of this LED module, and light emitting element-mounting areas on which the LEDs are mounted are formed so as to be exposed to the outside from the insulating layer.

Incidentally, for example, a resin material in which a pigment formed of white titanium oxide ($TiO_2$) is contained in an epoxy-based resin is used as the material of the insulating layer. However, the epoxy-based resin has inferior heat resistance. For this reason, when the temperature of a mounted component becomes high, it is difficult to apply an insulating layer, which is made of the epoxy-based resin, as the insulating layer of the outermost layer of a wiring board on which the mounted component is mounted.

SUMMARY OF THE INVENTION

According to one or more aspects of the present invention, there is provided a wiring board. The wiring board includes: a first insulating layer; a plurality of wiring patterns on the first insulating layer so as to be spaced apart from each other; a plating layer on at least one of the wiring patterns; a second insulating layer containing silicone therein and having an opening, wherein an outermost surface of the plating layer is exposed from the opening and serves as a connection pad; and a silica film on the outermost surface of the plating layer.

BRIEF DESCRIPTION OF THE DRAWINGS

FIGS. 6A to 6D are schematic cross-sectional views illustrating the method of manufacturing the light emitting device according to the first embodiment;

FIG. 10A is a schematic cross-sectional view of a light emitting device according to a second embodiment, which is taken along line 10-10 of FIGS. 11 and 12;

FIG. 10B is an enlarged cross-sectional view of a part of the light emitting device shown in FIG. 10A;

FIGS. 14A to 14C are schematic cross-sectional views illustrating the method of manufacturing the light emitting device according to the second embodiment;

FIGS. 15A to 15C are schematic cross-sectional views illustrating the method of manufacturing the light emitting device according to the second embodiment;

DETAILED DESCRIPTION

Embodiments will be described below with reference to the accompanying drawings. Meanwhile, for convenience, characteristic portions of the accompanying drawings may be shown in an enlarged manner for easy understanding of characteristics, and the dimensions and ratios of components are not limited to the same dimensions and ratios as the actual dimensions and actual ratios of components. Further, for easy understanding of the cross-sectional structure of each member, the hatching of some members will be omitted in a cross-sectional view.

<First Embodiment>

Figure 1A:
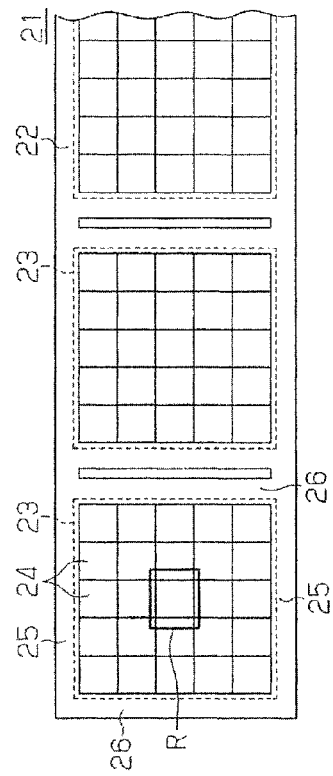
FIG. 1A is a schematic plan view of a lead frame according to a first embodiment.

A first embodiment will be described below with reference to FIGS. 1 to 7. As shown in FIG. 1A, a lead frame 21 includes a board frame 22 that has a substantially rectangular shape in a plan view. For example, copper (Cu), a Cu-based alloy, Fe—Ni, an Fe—Ni based alloy, or the like can be used as the material of the board frame 22. The thickness of the board frame 22 can be set in the range of, for example, about 50 µm to 250 µm.

A plurality of (here, three) resin-filling areas 23 are defined on the board frame 22 so as to be separated from each other. A plurality of wiring boards 24 are formed in each of the resin-filling areas 23 so as to be continuously arranged in the form of a matrix (here, 5×5). The wiring board 24 is a component on which a semiconductor element such as a light emitting element is finally mounted and which is to be divided as an individual semiconductor device (package). Meanwhile, a pair of rail portions 25 that extend in a longitudinal direction (a horizontal direction in FIG. 1A) and a pair of rail portions 26 that extend in a width direction (a vertical direction in FIG. 1A) are formed at the outer periphery of each of the resin-filling areas 23. Further, when a semiconductor device is to be assembled, each of the resin-filling areas 23 is sealed with a resin by a collective molding method after a semiconductor element is mounted on each of the wiring boards 24.

Figures 2A, 2B:
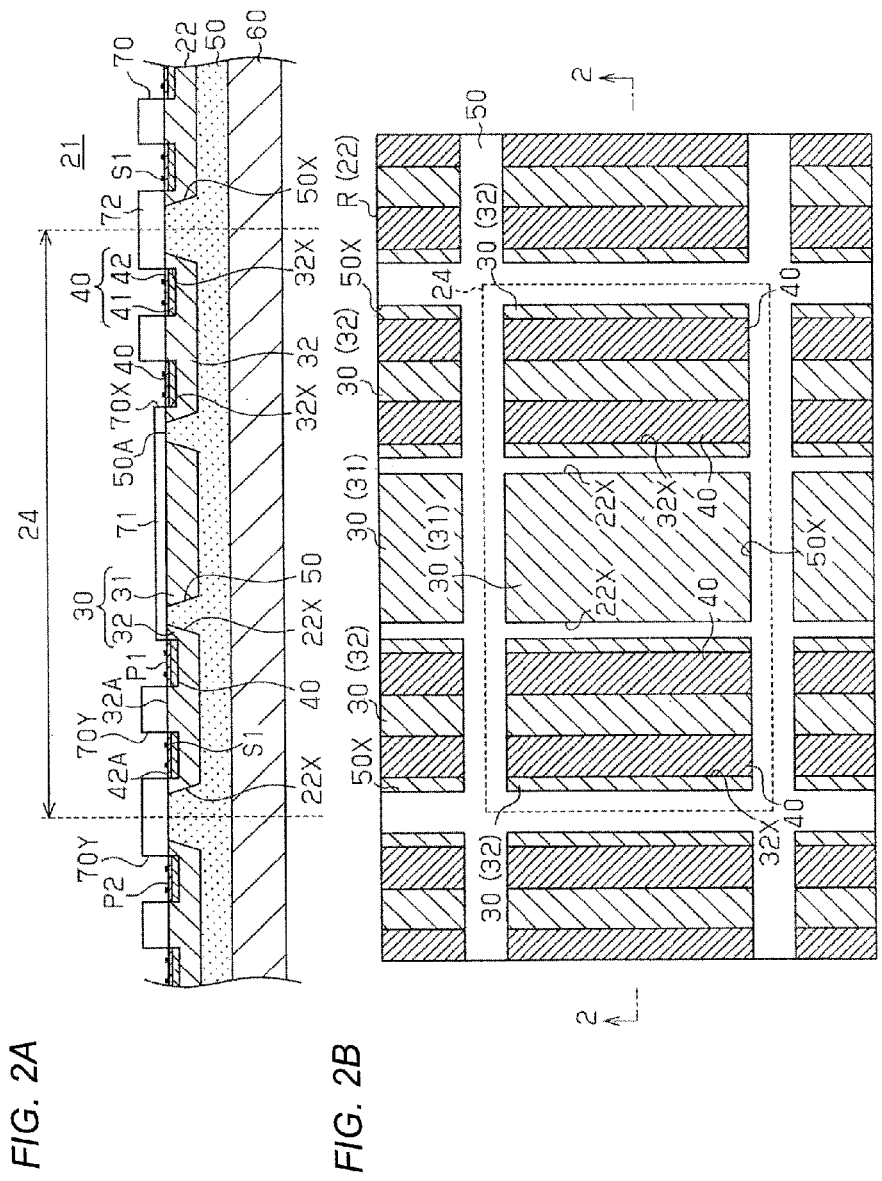
FIG. 2A is a schematic cross-sectional view of a part of the lead frame according to the first embodiment, which is taken along line 2-2 of FIGS. 1B and 2B.
FIG. 2B is an enlarged plan view of the area R shown in FIG. 1B, wherein some members (insulating layers formed on the outermost surface) are not shown in FIG. 2B.

As shown in FIG. 2A, the wiring board 24 (refer to a frame shown by a broken line) includes a plurality of (here, three) wiring patterns 30, plating layers 40, an insulating layer 50 that is formed between the respective wiring patterns 30, a heat dissipation plate 60, and an insulating layer 70.

As shown in FIG. 2B, the planar shape of each of the wiring patterns 30 is, for example, a substantially rectangular shape. These wiring patterns 30 are disposed in the middle portion of the wiring board 24 so as to be parallel and adjacent to each other. These wiring patterns 30 are separated from each other by openings 22X of the board frame 22. Further, the wiring patterns 30 of the adjacent wiring boards 24 are also separated from each other by the openings 22X. Meanwhile, similar to the case of the board frame 22, the thickness of the wiring pattern 30 can be set in the range of, for example, about 50 μm to 250 μm.

The wiring pattern 30 includes a wiring pattern 31 (a second wiring pattern) that is formed in a light emitting element-mounting area on which a light emitting element 81 (see FIG. 4) is to be mounted, and wiring patterns 32 (first wiring patterns) that are formed with the wiring pattern 31 interposed therebetween in a plan view.

As shown in FIG. 2A, recesses 32X (second recesses) are formed at certain (two in FIG. 2) positions on an upper surface 32A of each of the wiring patterns 32. Each of the recesses 32X is formed from the upper surface 32A of the wiring pattern 32 to an intermediate position of the wiring pattern 32 in the thickness direction. That is, each of the recesses 32X is formed so that the bottom of the recess is positioned in the middle of the wiring pattern 32 in the thickness direction. As shown in FIG. 2B, the planar shape of each of the recesses 32X is, for example, a substantially rectangular shape. These two recesses 32X are formed at a middle position of the wiring pattern 32 in the planar direction. For this reason, as shown in FIG. 2A, side walls of the two recesses 32X are formed by the wiring pattern 30.

Figure 1B:
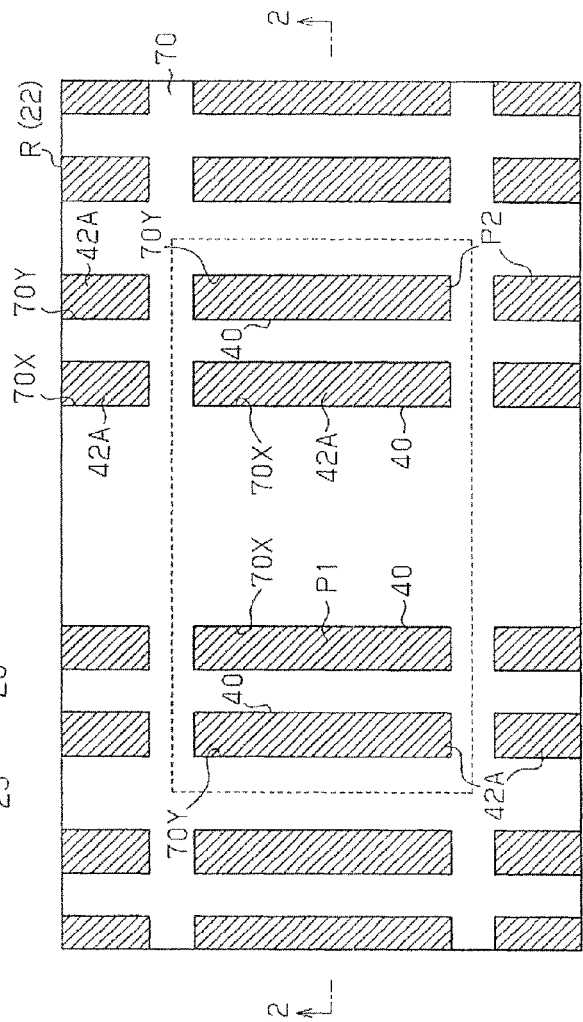
FIG. 1B is an enlarged plan view of an area R shown in FIG. 1A.

The plating layers 40 are formed in the recesses 32X of the wiring patterns 32. Further, side surfaces of the plating layers 40 are covered with the wiring pattern 30 that forms the side walls of the recesses 32X. As described above, the plating layers 40 are embedded in the wiring patterns 32. Similar to the case of the recess 32X, the planar shape of the plating layer 40 is a substantially rectangular shape as shown in FIGS. 1B and 2B.

Examples of the plating layers 40 may include a metal layer in which a Ni layer and a gold (Au) layer are sequentially formed from the bottom (a first surface) of the recess 32X. Further, other examples of the plating layers 40 may include a metal layer in which a Ni layer, a palladium (Pd) layer, and an Au layer are sequentially formed, a metal layer in which a Ni layer, a Pd layer, and a silver (Ag) layer are sequentially formed, and a metal layer in which a Ni layer, a Pd layer, an Ag layer, and an Au layer are sequentially formed. Here, the Ni layer is a metal layer that is made of Ni or a Ni alloy, the Au layer is a metal layer that is made of Au or an Au alloy, the Pd layer is a metal layer that is made of Pd or a Pd alloy, and the Ag layer is a metal layer that is made of Ag or an Ag alloy. Meanwhile, in this embodiment, a Ni layer 41 and an Au layer 42 are formed on the bottom of the recess 32X in this order, so that the plating layers 40 are formed. Further, the thickness of the Ni layer 41 can be set in the range of, for example, about 0.1 μm to 3 μm, and the thickness of the Au layer 42 can be set in the range of, for example, about 0.01 μm to 1 μm.

An upper surface 42A of the Au layer 42, which is the outermost surface of the plating layer 40, is formed so as to be substantially flush with the upper surface 32A of the wiring pattern 32. Silica ($SiO_2$) is contained in a part of the upper surface 42A of the Au layer 42. That is, a silica film S1 is formed on a part of the upper surface 42A of the Au layer 42. Further, it is preferable that silicone (Si—O) not be contained in the upper surface 42A of the Au layer 42 (a silicone film not be formed on the upper surface 42A of the Au layer 42). For example, when the upper surface 42A of the Au layer 42 is analyzed by an ESCA (an X-ray photoelectron spectrometer), silicone is not detected, silica is detected, and metal (here, Au) as a material of the Au layer 42 is detected. For example, Quantera SXM manufactured by ULVAC-PHI is used as a device and AlLα (monochromator) is used as an X-ray source according to an analysis condition of the ESCA. Further, a photoelectron ejection angle is set to 45 degree, an area to be measured is set to an area having a diameter of about 100 μm, and an electrical charge neutralizing mechanism is used according to the analysis condition of the ESCA.

As shown in FIG. 2A, the openings 22X are formed so as to pass through the board frame 22 in a thickness direction. Specifically, the openings 22X are formed in a tapered shape so that the width of the opening is increased toward the lower surface from the upper surface of the wiring pattern 30. Meanwhile, the inner wall surfaces of the openings 22X form the surfaces of the board frame 22 in the thickness direction, that is, the side surfaces of the wiring patterns 30.

The insulating layer 50 (a first insulating layer) is formed so as to cover all of the side surfaces of the wiring patterns 30. Specifically, the openings 22X are filled with the insulating layer 50. Further, the insulating layer 50 is formed so as to cover all of the lower surfaces of the wiring patterns 30. An upper surface 50A of the insulating layer 50 is formed so as to be substantially flush with the upper surfaces 32A of the wiring patterns 30. According to another aspect, recesses 50X (first recesses) are formed at certain positions on the upper surface 50A of the insulating layer 50. Each of the recesses 50X is extended from the upper surface 50A of the insulating layer 50 to an intermediate position of the insulating layer 50 in the thickness direction. That is, each of the recesses 50X is formed so that the bottom of the recess is positioned in the middle of the insulating layer 50 in the thickness direction. Similar to the case of the wiring patterns 30, the planar shape of each of the recesses 50X is, for example, a substantially rectangular shape as shown in FIG. 2B. Furthermore, the wiring patterns 30 are formed on the bottoms (the first surfaces) of the recesses 50X, and the side surfaces of the wiring patterns 30 are covered with the insulating layer 50 that forms the side walls of the recesses 50X. The wiring patterns 30 are embedded in the insulating layer 50 as described above.

The plurality of wiring patterns 30 are supported by the insulating layer 50. Specifically, the plurality of wiring patterns 30 formed in each of the wiring boards 24 are supported on the rail portions 25 and 26 (see FIG. 1A) by the insulating layer 50. The insulating layer 50 has a function of insulating the wiring patterns 30 from the heat dissipation plate 60 and a function of bonding the wiring patterns 30 to the heat dissipation plate 60.

For example, an insulating resin, such as a polyimide-based resin or an epoxy-based resin, or a resin material that is obtained by mixing a filler, such as silica, alumina oxide, boron nitride (BN) or aluminum nitride (AN) into an epoxy-based resin can be used as the material of the insulating layer 50. Meanwhile, the thickness of the insulating layer 50 between the lower surface of the wiring pattern 30 and the lower surface of the insulating layer 50 can be set in the range of, for example, about 50 μm to 150 μm.

The heat dissipation plate 60 is formed so as to cover the entire lower surface of the insulating layer 50. The heat dissipation plate 60 is bonded to the insulating layer 50. The heat dissipation plate 60 is, for example, a flat plate that has a substantially rectangular shape in a plan view. Meanwhile, the surface of the heat dissipation plate 60, which comes into contact with the insulating layer 50, may be roughened.

For example, metals, such as copper, aluminum (Al), and iron, which are excellent in thermal conductivity, or an alloy containing one or more kinds of these metals can be used as the material of the heat dissipation plate 60. Further, for example, a ceramic material, such as aluminum nitride, silicon nitride, or alumina, which is excellent in thermal conductivity, can be used as the material of the heat dissipation plate 60. Meanwhile, the thickness of the heat dissipation plate 60 can be set in the range of, for example, about 200 μm to 2000 μm. The heat dissipation plate 60 functions as a plate that supports the lead frame 21 and functions as a heat dissipation plate that dissipates heat generated when the light emitting element 81 (see FIG. 4) emits light. Here, the luminous efficiency of the light emitting element 81 (for example, a light emitting diode) tends to be decreased as the temperature of the light emitting element rises. For this reason, since heat generated from the light emitting element 81 is efficiently dissipated by the heat dissipation plate 60, it is possible to suitably suppress the deterioration of the luminous efficiency of the light emitting element 81.

The insulating layer 70 (a second insulating layer) is formed so as to cover the upper surfaces of the wiring patterns 30 and the upper surface of the insulating layer 50. For example, the insulating layer 70 is formed so as to cover the upper surfaces of the wiring patterns 30 and the upper surface of the insulating layer 50 except for the plating layers 40. That is, the insulating layer 70 includes openings 70X and 70Y through which the plating layers 40 are exposed to the outside. The opening 70X allows the entire upper surface 42A of the inner plating layer 40 (close to the wiring pattern 31) of the two plating layers 40, which are formed on each of the wiring patterns 32, to be exposed to the outside as a connection pad P1 that is electrically connected to the light emitting element 81 mounted on the light emitting element-mounting area. Further, the opening 70Y allows the entire upper surface 42A of the outer plating layer 40 of the two plating layers 40, which are formed on each of the wiring patterns 32, to be exposed to the outside as an electrode terminal P2 that is electrically connected to a mounting board (not shown). Similar to the case of the plating layers 40, each of the planar shapes of these openings 70X and 70Y is a substantially rectangular shape as shown in FIG. 1B.

A material, which is excellent in heat resistance, can be used as the material of the insulating layer 70. For example, a resin material containing silicone can be used as the material of the insulating layer 70. A material, which contains silicone as a basic structure, has excellent properties, such as high heat resistance and high light resistance. For this reason, a resin material containing silicone is suitable as the material of an insulating layer, which is formed on the outermost surface of the lead frame 21, similar to the insulating layer 70.

In addition, it is preferable that the insulating layer 70 have high reflectance. For example, the insulating layer 70 has a reflectance of 50% or more (preferably 80% or more) in the wavelength range of 450 nm to 700 nm. This insulating layer 70 is also called a white resist layer or a reflective layer. For example, a white insulating resin can be used as the material of this insulating layer 70. For example, a resin material in which a pigment or a filler formed of white titanium oxide ($TiO_2$), barium sulfate ($BaSO_4$), alumina, or the like is contained in a silicone-based resin can be used as the white insulating resin. Since the outermost surface of the wiring board 24 is covered with this insulating layer 70 (a white resist layer), it is possible to improve reflectance for light emitted from the light emitting element 81 mounted on the wiring board 24 and to reduce a loss in the amount of light emitted from the light emitting element 81.

The insulating layer 70 includes an insulating layer 71 that covers the upper surface of the wiring pattern 31 and the upper surfaces of the insulating layer 50 and the wiring patterns 32 around the wiring pattern 31, and an insulating layer 72 that covers the upper surfaces of the insulating layer 50 and the wiring patterns 32 exposed from the insulating layer 71. The insulating layer 71 is formed to be thinner than the insulating layer 72. That is, the insulating layer 71 is formed so that the upper surface of the insulating layer 71 is lower than the upper surface of the insulating layer 72. The thickness of the insulating layer 71 can be set in the range of, for example, about 10 μm to 30 μm, and the thickness of the insulating layer 72 can be set in the range of, for example, about 20 μm to 50 μm.

Figure 3:
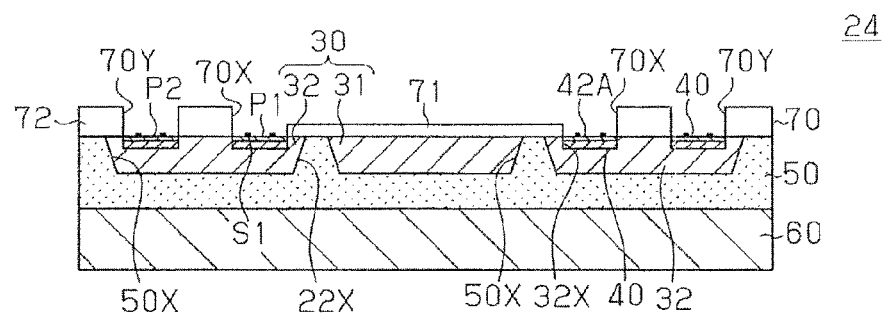
FIG. 3 is a schematic cross-sectional view of a wiring board according to the first embodiment.

As shown in FIG. 3, the side surfaces of the insulating layer 50, the heat dissipation plate 60, and the insulating layer 70 are exposed to the cut surfaces of the wiring board 24 that is obtained by cutting and dividing the insulating layers 50 and 70 and the heat dissipation plate 60 at the positions of the broken line shown in FIG. 2A. That is, the side surfaces of the wiring patterns 30 (the board frame 22) are not exposed to the cut surfaces of the wiring board 24.

Next, the structure of a light emitting device 80 will be described.

Figure 4:
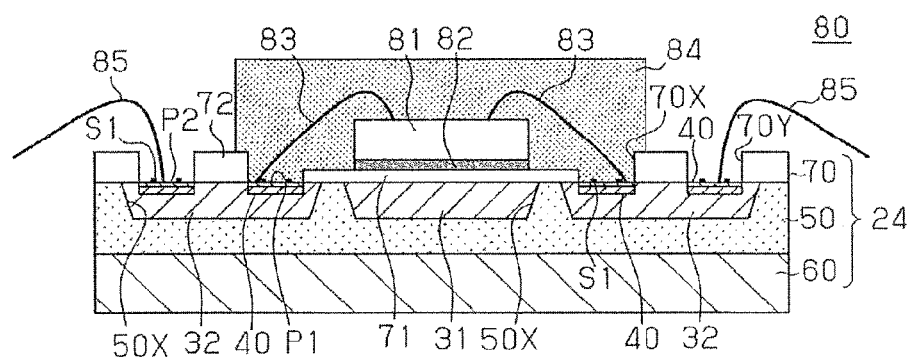
FIG. 4 is a schematic cross-sectional view of a light emitting device according to the first embodiment.

As shown in FIG. 4, the light emitting device 80 includes the wiring board 24, one or more light emitting elements 81 that are mounted on the wiring board 24, bonding wires 83, a sealing resin 84 that seals the light emitting elements 81, the bonding wires 83, and the like, and wires 85 for external connection.

The light emitting element 81 is mounted on the insulating layer 71 of the wiring board 24. Specifically, the light emitting element 81 is bonded to the insulating layer 71 by an adhesive 82. Further, one electrode (not shown) of the light emitting element 81 is electrically connected to the inner plating layer 40 (close to the wiring pattern 31), which is formed on one wiring pattern 32, through the bonding wire 83, and the other electrode (not shown) thereof is electrically connected to the inner plating layer 40 (close to the wiring pattern 31), which is formed on the other wiring pattern 32, through the bonding wire 83. That is, the respective electrodes of the light emitting element 81 are electrically connected to the plating layers 40 exposed to the outside through the openings 70X of the insulating layer 70, that is, the connection pads P1 through the bonding wires 83. Accordingly, the light emitting element 81 is electrically connected to the wiring patterns 32 through the bonding wires 83 and the plating layers 40.

The plating layers 40 exposed to the outside through the openings 70Y of the insulating layer 70, that is, the electrode terminals P2 are electrically connected to a mounting board (not shown) through the wires 85 for external connection. By this connection, power is supplied to the light emitting element 81 from an external power source (not shown) through the mounting board, the electrode terminals P2, the wiring patterns 32, and the like, so that the light emitting element 81 emits light.

For example, a light emitting diode (LED) or a vertical cavity surface emitting laser (VCSEL) can be used as the light emitting element 81. For example, an Au wire, an aluminum (Al) wire, a Cu wire, or the like can be used as each of the bonding wire 83 and the wire 85 for external connection.

The sealing resin 84 is provided on the upper surface of the wiring board 24 so as to seal the light emitting element 81, the bonding wires 83, and the like. Meanwhile, the electrode terminals P2 and the periphery of the electrode terminals P2 are not sealed with the sealing resin 84. For example, a material in which a phosphor is contained in a silicone resin can be used as the material of the sealing resin 84. Since the resin material containing this phosphor is formed on the light emitting element 81, it is possible to use a mixture of the color of the light emitted from the light emitting element 81 and the color of the light emitted from the phosphor. Accordingly, it is possible to control the color of the light, which is emitted from the light emitting device 80, in various ways.

Next, a method of manufacturing the light emitting device 80 will be described.

Figure 5A:
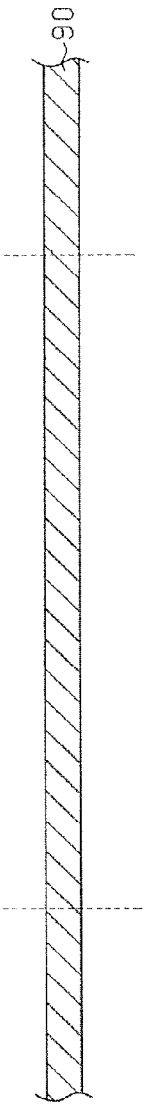
FIGS. 5A to 5D are schematic cross-sectional views illustrating a method of manufacturing the light emitting device according to the first embodiment.

First, a conductive substrate 90, which is a base material of the board frame 22, is prepared as shown in FIG. 5A. For example, a metal plate made of Cu, a Cu-based alloy, Fe—Ni, or an Fe—Ni based alloy can be used as the material of the conductive substrate 90. The thickness of the conductive substrate 90 can be set in the range of for example, about 50 μm to 250 μm.

Figure 5B:
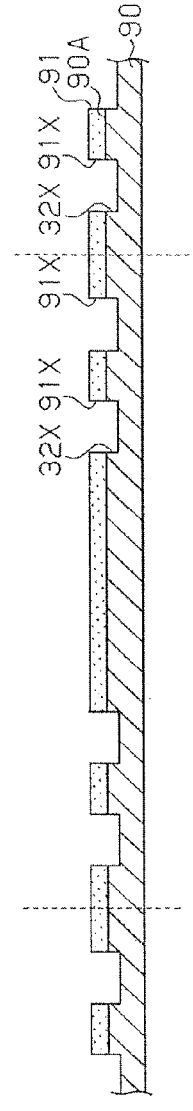

Next, in a step illustrated in FIG. 5B, a resist layer 91, which includes opening patterns 91X at predetermined positions, is formed on an upper surface 90A of the conductive substrate 90. Meanwhile, the upper surface 90A of the conductive substrate 90 may be roughened if necessary, and the resist layer 91 may be formed on the roughened upper surface 90A. The opening patterns 91X are formed so that portions of the conductive substrate 90 corresponding to areas in which the recesses 32X are to be formed are exposed to the outside through the opening patterns 91X. A material having etching resistance and plating resistance can be used as the material of the resist layer 91. Specifically, a photosensitive dry film resist, a liquid photoresist (for example, a dry film resist, such as a novolac-based resin or an acrylic resin, or a liquid resist), or the like can be used as the material of the resist layer 91. For example, when a photosensitive dry film resist is used, a dry film is laminated on the upper surface 90A of the conductive substrate 90 by thermal compression and the dry film is patterned by a photolithography so that the resist layer 91 having the opening patterns 91X is formed. Meanwhile, when a liquid photoresist is used, the resist layer 91 can be formed by the same step as described above.

Subsequently, while the resist layer 91 is used as an etching mask, half-etching is performed on portions of the conductive substrate 90 exposed to the outside through the opening patterns 91X so that the portions of the conductive substrate 90 are removed to a certain depth and are made thin. Accordingly, the recesses 32X are formed on the conductive substrate 90 that is exposed to the outside through the opening patterns 91X. An etchant, which is used in this step, can be appropriately selected according to the material of the conductive substrate 90. When copper is used as the material of the conductive substrate 90 and the depth of the recess 32X is smaller than 5 μm, for example, a persulfate etchant can be preferably used as the etchant. Further, when copper is used as the material of the conductive substrate 90 and the depth of the recess 32X is 5 μm or greater, for example, an Iron (II) chloride aqueous solution or a copper (II) chloride aqueous solution can be preferably used as the etchant. Meanwhile, the recesses 32X can be formed by this etching (half-etching), but the recesses 32X can also be formed by, for example, pressing.

Figure 5C:
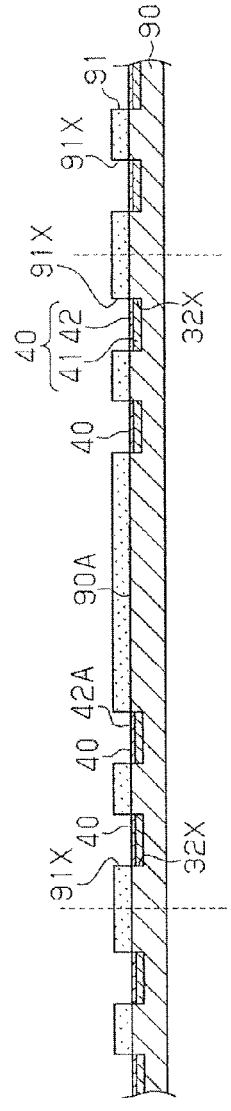

Next, in a step illustrated in FIG. 5C, an electrolytic plating method using the conductive substrate 90 as a plating-power supply layer is performed in the recesses 32X while the resist layer 91 is used as a plating mask. Specifically, an electrolytic plating method is performed on the portions of the conductive substrate 90 exposed to the outside through the opening patterns 91X of the resist layer 91, that is, in the recesses 32X, so that the plating layer 40 is formed in each of the recesses 32X. Here, when the plating layer 40 has a structure in which the Ni layer 41 and the Au layer 42 are sequentially formed, the Ni layer 41 and the Au layer 42 are sequentially formed on each of the bottoms of the recesses 32X, which are exposed to the outside through the opening patterns 91X of the resist layer 91, by an electrolytic plating method. In this embodiment, the upper surface 42A of the plating layer (that is, the Au layer 42) formed on the uppermost layer is formed so as to be substantially flush with the upper surface 90A of the conductive substrate 90. Meanwhile, the upper surface 42A of the plating layer 40 formed in each of the recess 32X may be formed at a position that is recessed from the upper surface 90A of the conductive substrate 90. Further, the upper surface 42A of the plating layers 40 may be formed so as to protrude upward from the upper surface 90A of the conductive substrate 90. However, when the upper surface 42A of the plating layer 40 is made to protrude upward from the upper surface 90A of the conductive substrate 90, it is preferable that the protruding amount of the plating layer 40 be smaller than the thickness of an adhesive 92B of a tape 92 used in the following step.

After that, the resist layer 91 is removed by, for example, an alkaline stripping solution.

Figure 5D:
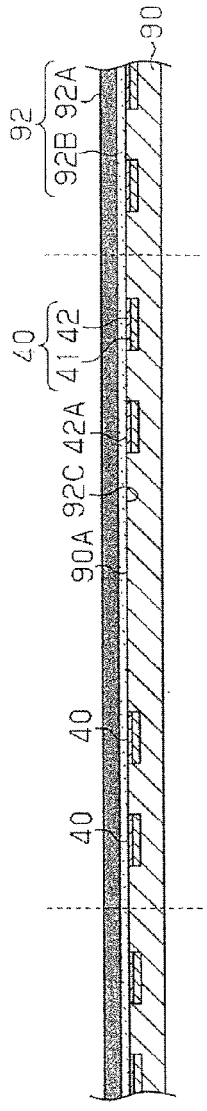

Subsequently, in a step (a first step) illustrated in FIG. 5D, a tape 92 is bonded to the upper surface 90A of the conductive substrate 90. Specifically, a surface 92C, which is subjected to the application of an adhesive 92B, of a film-like tape base material 92A of which one surface is subjected to the application of the adhesive 92B is attached to the upper surface 90A of the conductive substrate 90. For example, a sheet-like tape 92 is laminated on the upper surface 90A of the conductive substrate 90 by thermal compression. Since the upper surface 90A of the conductive substrate 90 and the upper surface 42A of the plating layer 40 are formed so as to be substantially flush with each other at this time, the adhesive 92B of the tape 92 can be formed to be thin. The thickness of the adhesive 92B can be set in the range of, for example, about 1 μm to 5 μm. That is, since the surfaces (the upper surface 90A of the conductive substrate 90 and the upper surfaces 42A of the plating layers 40) with which the adhesive 92B comes into contact are flat surfaces having less unevenness, it is possible to suppress the occurrence of a problem in the deterioration of the bond strength and adhesion between the tape 92 and the conductive substrate 90, which is caused by the unevenness, even when the adhesive 92B is formed to be thin.

Here, for example, a material, which is excellent in chemical resistance or heat resistance, can be used as the material of the tape 92. Further, it is preferable that the material of the tape base material 92A be, for example, a material having excellent workability. For example, a polyimide resin or a polyester resin can be used as the material of the tape base material 92A. Furthermore, it is preferable that the material of the adhesive 92B be a material capable of being easily stripped from the insulating layer 50 (see FIG. 2) formed in the following step. For example, a silicone-based adhesive material, an acrylic adhesive material, or an olefin-based adhesive material can be used as the material of the adhesive 92B. Meanwhile, the thickness of the tape base material 92A can be set in the range of, for example, about 20 μm to 50 μm.

Moreover, the thickness of the adhesive 92B can be set in the range of, for example, about 1 µm to 5 µm.

Next, in a step illustrated in FIG. 6A, a resist layer 93, which includes openings 93X corresponding to the shapes of the openings 22X, is formed on a lower surface 90B of the conductive substrate 90. A material having etching resistance can be used as the material of the resist layer 93. Specifically, a photosensitive dry film resist, a liquid photoresist (for example, a dry film resist, such as a novolac-based resin or an acrylic resin, or a liquid resist), or the like can be used as the material of the resist layer 93. It is possible to form the resist layer 93 by the same method as the method of forming the resist layer 91.

Next, while the resist layer 93 is used as an etching mask, the conductive substrate 90 is etched from the lower surface 90B so that the board frame 22 shown in FIG. 6A is formed. Specifically, the conductive substrate 90 exposed to the outside through the openings 93X of the resist layer 93 is etched from the lower surface 90B, so that the openings 22X are formed at the conductive substrate 90. Accordingly, the board frame 22 is formed. The plurality of wiring patterns 30 (specifically, one wiring pattern 31 and two wiring patterns 32) are formed in each of the wiring boards 24 by the formation of the openings 22X. Meanwhile, when the conductive substrate 90 is to be patterned by wet etching (isotropic etching), an etchant used in the wet etching can be appropriately selected according to the material of the conductive substrate 90. For example, when copper is used as the material of the conductive substrate 90, an Iron (II) chloride aqueous solution or a copper (II) chloride aqueous solution can be used as the etchant and the conductive substrate can be patterned by spray etching performed from the lower surface 90B of the conductive substrate 90. When the conductive substrate 90 is patterned by wet etching as described above, the wiring patterns 30 are formed so as to have a trapezoidal cross-sectional shape by a side etching phenomenon in which etching occurs in the in-plane direction of the conductive substrate 90. Meanwhile, in this step, the tape 92 functions as an etching stopper layer.

While the conductive substrate 90 is attached to the tape 92, the conductive substrate 90 is patterned as described above so that the board frames 22 (the wiring patterns 30) are formed in this step. For this reason, even though only the wiring patterns 30 are made to remain by etching, that is, only wiring patterns 30 are made to remain without section bars or support bars required in the lead frame in the related art, the wiring patterns 30 can be held by the tape 92. In other words, the tape 92 of this step functions as a temporary base material that holds the board frames 22 (the wiring patterns 30) at predetermined positions.

Subsequently, the resist layer 93 is removed by, for example, an alkaline stripping solution. After that, in a step illustrated in FIG. 6B, the insulating layer 50, which covers the wiring patterns 30, and the heat dissipation plate 60 are formed on a surface 92C of the tape 92 in this order. The formation of the insulating layer 50 and the disposition of the insulating layer 50 and the heat dissipation plate 60 can be performed by, for example, a resin molding method. For example, when a mold resin having a thermosetting property is used as the material of the insulating layer 50, a structure, which is obtained by removing the resist layer 93 from FIG. 6A, and the heat dissipation plate 60 are received in a mold so as to be spaced apart from each other by a predetermined distance and a heating treatment and a pressurizing treatment are performed while the mold resin is filled in the corresponding resin-filling area 23 (see FIG. 1A) from a gate portion (not shown). Accordingly, as shown in FIG. 6B, the insulating layer 50 is formed between the wiring patterns 30 and the heat dissipation plate 60 so as to fill the openings 22X, and the insulating layer 50 and the heat dissipation plate 60 are disposed on the surface 92C of the tape 92. At this time, the upper surfaces of the wiring patterns 30, which come into contact with the surface 92C of the tape 92, and the upper surface of the insulating layer 50 are formed in the shape corresponding to the surface 92C (flat surface) of the tape 92. For this reason, the upper surfaces of the wiring patterns 30 and the upper surface of the insulating layer 50 are formed flat. Meanwhile, for example, methods, such as transfer molding and injection molding, can be used as a method of filling the mold resin.

Further, the formation of the insulating layer 50 and the heat dissipation plate 60 can also be performed by, for example, the following method. First, a structure in which the sheet-like insulating layer 50 is bonded to the heat dissipation plate 60 is prepared, and the structure is disposed on the surface 92C of the tape 92 so that the insulating layer 50 faces the lower surfaces of the wiring patterns 30. At this time, an insulating layer in a B-stage state is used as the insulating layer 50. Next, the two above-mentioned structures are heated and pressurized from both sides thereof in a vacuum atmosphere at a temperature in the range of about 80° C. to 200° C. Accordingly, the insulating layer 50 is filled in the openings 22X and the wiring patterns 30 are covered with the insulating layer 50. Further, the insulating layer 50 is cured and then the insulating layer 50 is bonded to the wiring patterns 30 with the curing of the insulating layer 50.

Meanwhile, the planar shapes and the sizes of the insulating layer 50 and the heat dissipation plate 60 are formed so as to be substantially the same as, for example, the planar shapes and the sizes of the resin-filling areas 23 (see FIG. 1A).

Next, in a step illustrated in FIG. 6C, the tape 92 shown in FIG. 6B is stripped and removed and is cured by heating. However, in this stage, there is a possibility that a part of the adhesive 92B (see FIG. 6B) of the stripped tape 92 remains on the upper surfaces of the wiring patterns 30. Further, the adhesive 92B, which may remain, may be removed by, for example, ashing (dry etching using oxygen plasma) or blasting. When the tape 92 is removed as described above, the upper surfaces of the wiring patterns 30 formed flat as described above and the upper surface of the insulating layer 50 are exposed to the outside.

Subsequently, in a step illustrated in FIG. 6D, the insulating layer 70, which includes the openings 70X and 70Y corresponding to the connection pads P1 and the electrode terminals P2, is formed on the wiring patterns 30 and the insulating layer 50. Specifically, the insulating layer 70 through which the upper surfaces of the plating layers 40 are exposed to the outside is formed on the wiring patterns 30 and the insulating layer 50. It is possible to form the insulating layer 70 by, for example, a screen printing method using resin paste. Further, it is also possible to form the insulating layer 70 by applying a liquid resin with an injector (dispenser). When a photosensitive insulating resin is used as the material of the insulating layer 70, the insulating layer 70 can also be formed by a photolithography. Furthermore, the insulating layers 71 and 72 having different thicknesses can also be formed as follows: that is, it is possible to form the insulating layer 71, which is thinner than the insulating layer 72, on the wiring patterns 31 by reducing the thickness of the insulating layer 71 by blasting after forming the insulating layer 72 and the insulating layer 71 having the same thickness as the thickness of the insulating layer 72 on the wiring patterns 30 and the insulating layer 50. Further, the insulating layers 71 and 72 may be formed by different steps so that the insulating layers 71 and 72 having different thicknesses are formed. For example, after the insulating layer 71 is formed while an area on which the insulating layer 72 is to be formed and the upper surfaces of the plating layers 40 are masked, the insulating layer 72 may be formed while an area on which the insulating layer 71 is formed and the upper surfaces of the plating layers 40 are masked. At this time, the formation order of the insulating layers 71 and 72 is not particularly limited.

Subsequently, in the step illustrated in FIG. 6D, the insulating layer 70 is cured by curing (a thermal curing treatment) at an atmospheric temperature of about 150° C.

Since the insulating layer 70 is formed, the inner plating layer 40 of two plating layers 40 formed on the wiring pattern 30 is exposed to the outside through the opening 70X as the connection pad P1 and the outer plating layer 40 of the two plating layers 40 is exposed to the outside through the opening 70Y as the electrode terminal P2. For this reason, electrolytic plating does not need to be performed on the wiring patterns 30 for the improvement of a contact property after the formation of the insulating layer 70. Accordingly, since the insulating layer 70 is not immersed in a plating solution present in a plating bath when electroless plating or electrolytic plating is performed, it is possible to prevent the plating solution from soaking into the insulating layer 70. As a result, it is possible to suppress the reduction of the reflectance of the insulating layer 70. In addition, it is possible to suppress the deterioration of a plating solution that is used in the electroless plating, the electrolytic plating, or the like. In detail, when a plating method (an electrolytic plating method or an electroless plating method) is performed on the wiring patterns 30 exposed to the outside through the openings 70X and 70Y after the insulating layer 70 is formed, resin materials and the like contained in the insulating layer 70 are eluted into the plating solution that is used at this time. For this reason, there is a problem in that the deterioration of the plating solution and the shortening of the life of the plating solution caused by the deterioration of the plating solution occur. In contrast, according to the method of manufacturing the light emitting device of this embodiment, since the insulating layer 70 is not formed when an electrolytic plating method is performed, it is possible to prevent the occurrence of the above-mentioned problem. That is, according to the method of manufacturing the light emitting device of this embodiment, since it is possible to suppress the deterioration of the plating solution, it is possible to suppress the shortening of the life of the plating solution.

However, from the earnest study of the inventors, it has been found that it is difficult to bond the bonding wires 83 to the plating layers 40 when the light emitting element 81 mounted on the insulating layer 71 and the plating layers 40 are bonded to each other by wires if the plating layers 40 have been formed prior to the formation of the insulating layer 70. In detail, first, when the insulating layer 70 has been formed after the plating layers 40 are formed, low-molecular-weight silicone (Si—O) is volatilized from the insulating layer 70 in a heating treatment for curing the insulating layer 70. From the earnest study of the inventors, it has been found that the volatilized silicone adheres to the upper surface 42A of the plating layer 40 (specifically, the Au layer 42). Further, it has been found that silicone adhering to the upper surface 42A of the plating layer 40 becomes an obstacle to wire bonding. Here, the Si—O—Si bond (siloxane bond) of silicone has flexibility. For this reason, since silicone is microscopically and easily deformed, it is considered that the Si—O—Si bond of the silicone is not easily broken due to ultrasonic vibration caused by the wire bonding. Accordingly, it is considered that a silicone film remains on the plating layer 40 (Au layer 42) and the bonding wires 83 (for example, an Au wire) and the remaining silicone film causes the reduction of wire bonding strength.

Figures 7A, 7B, 7C:
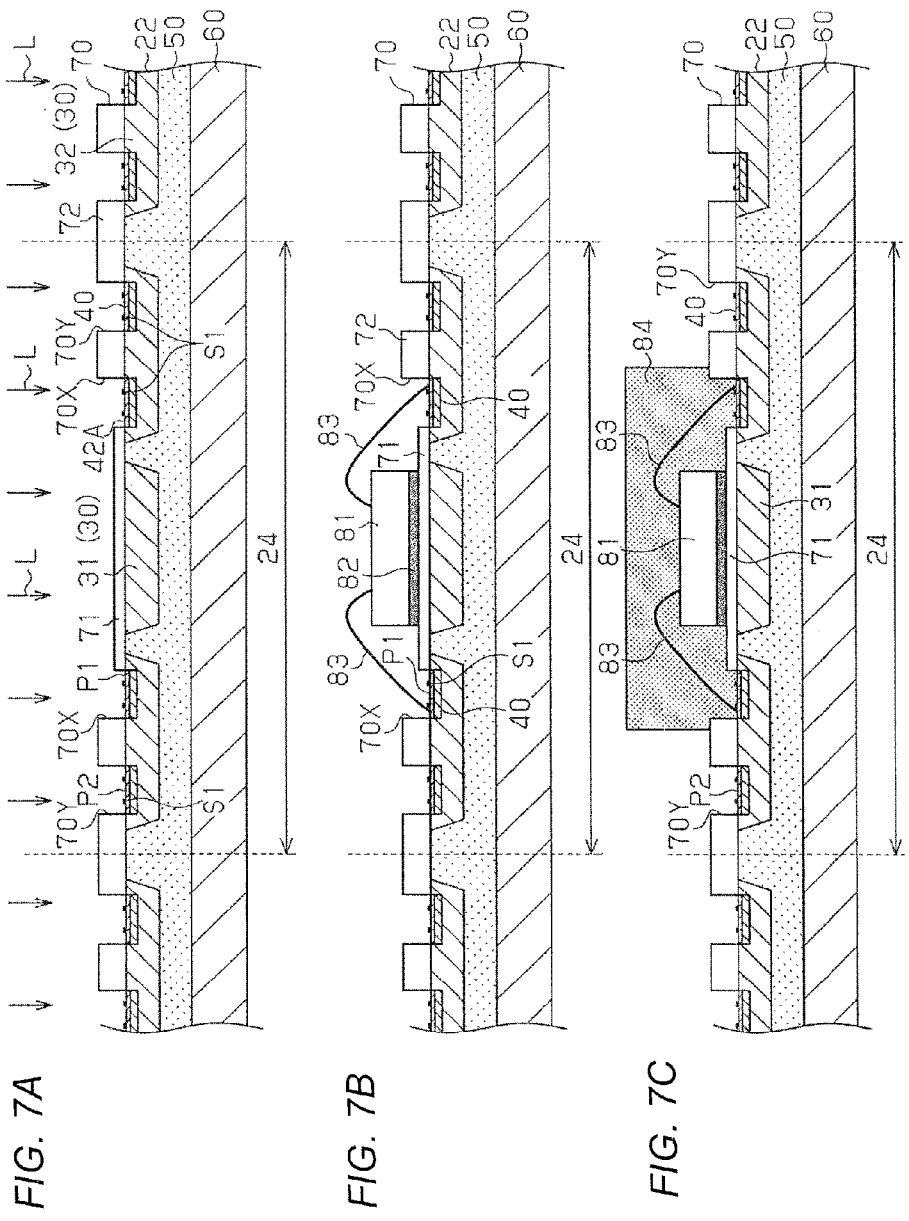
FIGS. 7A to 7C are schematic cross-sectional views illustrating the method of manufacturing the light emitting device according to the first embodiment.

Furthermore, in a step illustrated in FIG. 7A, a surface treatment, which changes the silicone film formed on the plating layer 40 to a state allowing wire bonding, is performed on the structure shown in FIG. 6D. This surface treatment is performed by making oxygen active species act on the upper surface 42A of the plating layer 40. The oxygen active species indicates an oxygen atom in an excited state. For example, triple oxygen atom, ozone, singlet oxygen atom, hydroxyl radical or the like is considered as an oxygen atom in an excited state. Accordingly, the silicone film formed on the plating layer 40 is removed, and a silica film S1 is formed on the plating layer 40 instead.

For example, in the embodiment shown in FIG. 7A, an ultraviolet treatment is performed on the structure shown in FIG. 6D to change the silicone film into a silica film S1 for the removal of the silicone film. That is, the upper surface (at least the upper surfaces 42A of the plating layers 40) of the structure shown in FIG. 6D is irradiated with ultraviolet light L. Oxygen is excited by the ultraviolet light L, so that the amount of oxygen active species determined according to the oxygen concentration, the ultraviolet wavelength, and illuminance of a treatment chamber in which a workpiece (here, the structure shown in FIG. 6D) is placed is generated. Further, the oxygen active species react with the silicone film, so that a $SiO_2$ film is formed. As a result, the silicone film is removed from the upper surfaces 42A of the plating layers 40. Here, ultraviolet light (excimer UV light), which is much absorbed by oxygen and has a wavelength of 172 nm, can be suitably used as the ultraviolet light L. When excimer UV light is used as the ultraviolet light L, the oxygen concentration can be set in the range of, for example, about 0.01% to 5%. Furthermore, the irradiation amount of excimer UV light (=illuminance×irradiation time) can be set in the range of, for example, about 500 $mJ/cm^2$ to 4000 $mJ/cm^2$. Meanwhile, the irradiation amount depends on the interval between an irradiation lamp (for example, a dielectric barrier discharge excimer lamp) that emits excimer UV light and the surface of a workpiece, and oxygen concentration.

Further, an oxygen plasma treatment may be performed on the structure shown in FIG. 6D to change the silicone film into a silica film ($SiO_2$) S1 for the removal of the silicone film. That is, the surface treatment of the plating layers 40 may be performed using oxygen active species generated by plasma of an oxygen gas (that is, plasma using oxygen as a source). Specifically, when an oxygen gas is introduced in a high frequency electric field, the oxygen gas is changed into, for example, plasma and decomposed. Accordingly, the oxygen active species are generated in the oxygen plasma treatment. Further, the oxygen active species react with the silicone film, so that a $SiO_2$ film is formed. As a result, the silicone film is removed from the upper surfaces of the plating layers 40. Meanwhile, for example, an RF output of 250 W, an oxygen flow rate of 15 sccm, a degree of vacuum of 20 Pa, and a treatment time of about 30 sec can be used as the conditions of the oxygen plasma treatment.

Meanwhile, a plasma treatment using carbon tetrafluoride ($CF_4$) as a source may be performed on the structure shown in FIG. 6D to remove the silicone film formed on the Au layer 42. However, a system for removing hydrofluoric acid of an exhaust gas, a combustion system for reducing a $CF_4$ gas to be discharged to the atmosphere, or the like is required in these plasma treatments. Further, in the case of a plasma treatment using a $CF_4$ gas as a source, the silica film S1 also does not remain on the Au layer 42 but fluorine remains on the upper surface 42A of the Au layer 42 and the insulating layer 70. Since this fluorine degrades wire bondability, a plasma treatment using a $CF_4$ gas as a source is not preferable.

A structure in which the plurality of wiring boards 24 are continuously arranged in the form of a matrix, that is, the lead frame 21 shown in FIGS. 1 and 2 is manufactured by the above-mentioned manufacturing steps.

Next, in a step illustrated in FIG. 7B, one or more light emitting elements 81 are mounted on each of the wiring boards 24 by wire bonding. In detail, first, the light emitting element 81 is mounted on the insulating layer 71, which is formed in the light emitting element-mounting area of each of the wiring boards 24, by the adhesive 82. Subsequently, electrodes (not shown) of the light emitting element 81 are connected to the plating layers 40 (that is, the connection pads P1), which are exposed to the outside through the openings 70X of the insulating layer 70, by the bonding wires 83, and the light emitting element 81 is electrically connected to the wiring patterns 32. Specifically, one electrode of the light emitting element 81 is electrically connected to one connection pad P1 by the bonding wire 83, and the other electrode of the light emitting element 81 is electrically connected to the other connection pad P1 by the bonding wire 83.

When the bonding wires 83 are connected to the plating layers 40 in this step, a silica film S1 has been formed on a part of the upper surfaces 42A of the plating layers 40 but a silicone film has not been formed on the upper surfaces 42A of the plating layers 40. That is, since a silicone film is removed from the surfaces of the plating layers 40 by a surface treatment that uses the above-mentioned oxygen active species, an obstacle to wire bonding caused by the silicone film does not occur when the bonding wires 83 are connected to the plating layers 40. Meanwhile, since the silica film S1, which is an insulating film, is formed on the plating layers 40 instead of the silicone film, it is also considered that the silica film S1 causes an obstacle to wire bonding. However, when the silica film S1 has been formed on the plating layers 40, it is possible to improve wire bondability further than in a case in which the silicone film has been formed on the plating layers 40, as also shown in experimental results to be described below. That is, when the silicone film formed on the plating layers 40 is changed into the silica film S1, bonding failure does not easily occur between the plating layers 40 and the bonding wires 83. Accordingly, it is possible to improve wire bonding strength. This can be considered as follows: that is, since molecular structure of $SiO_2$ is rigid, it is considered that silica ($SiO_2$) remaining on the plating layers 40 is easily broken by the ultrasonic vibration of wire bonding. Further, it is considered that the reduction of wire bonding strength is suppressed since molecules having been subjected to shear failure are scattered to the bonding wires 83 (Au wires) or the Au layers 42 and the Au wires and the interfaces of the Au layers 42 are integrated.

Next, the sealing resin 84, which seals the light emitting element 81 mounted on the wiring board 24 and the bonding wires 83, is formed in a step illustrated in FIG. 7C. For example, a part of each of the resin-filling areas 23 of the surfaces (the upper surfaces in FIG. 7C) of the lead frames 21, on which the light emitting elements 81 are mounted, is sealed with the sealing resin 84 by a collective molding method. Accordingly, the light emitting element 81 mounted on each of the wiring boards 24 and the bonding wires 83 are sealed with the sealing resin 84. Although not particularly shown, in this sealing step, the structure shown in FIG. 7B is placed on a lower mold of, for example, a molding mold (a set of upper and lower molds), is covered with the upper mold from above so as to be interposed between the upper and lower molds, and is heated and pressurized while an insulating resin is filled in the corresponding resin-filling area 23 (see FIG. 1A) from a mold gate portion (not shown). For example, a mold resin, which is formed by a transfer molding method, a compression molding method, an injection molding method, or the like, can be used as the sealing resin 84.

After that, the insulating layers 50 and 70 and the heat dissipation plate 60 are cut at the cutting positions, which are shown by a broken line, by a dicing blade or the like. Accordingly, a plurality of light emitting devices 80 (see FIG. 4), which include the light emitting elements 81 mounted on the wiring boards 24, are manufactured. Further, when the light emitting device 80 is mounted on a mounting board, the wires 85 for external connection are connected to the plating layers 40 that are exposed to the outside through the openings 70Y of the insulating layer 70.

According to the above-mentioned first embodiment, the following effects can be obtained.

(1) The insulating layer 70, which contains silicone excellent in heat resistance and light resistance, is formed on the outermost layer of the wiring board 24. Accordingly, it is possible to improve heat resistance further than in a case in which an insulating layer made of an epoxy-based resin is formed on the outermost layer of the wiring board 24. For this reason, even when the temperature of a mounted component (here, the light emitting element 81) becomes high, it is possible to apply the insulating layer 70, which contains silicone, to an insulating layer of the outermost layer of the wiring board 24.

(2) After the plating layers 40 are formed on the bottoms of the recesses 32X of the wiring patterns 32 by an electrolytic plating method, the insulating layer 70 including the openings 70X and 70Y through which the plating layers 40 are exposed to the outside are formed. In this case, since the insulating layer 70 has not been formed when the plating layers 40 are formed by an electrolytic plating method, it is possible to prevent the deterioration of a plating solution that is caused by the presence of the insulating layer 70. Accordingly, it is possible to lengthen the life of a plating solution and to continue to use the plating solution. As a result, it is possible to contribute to reduction in cost.

In addition, since the insulating layer 70 is not immersed in a plating solution present in a plating bath when electroless plating or electrolytic plating is performed, it is possible to prevent the plating solution from soaking into the insulating layer 70. Accordingly, it is possible to suppress the reduction of the reflectance of the insulating layer 70.

(3) After a thermal curing treatment is performed on the insulating layer 70 and before the light emitting element 81 is mounted, a surface treatment using oxygen active species is performed on the upper surfaces 42A of the plating layers 40 (specifically, the Au layers 42). Accordingly, even though silicone adheres to the upper surfaces 42A of the Au layers 42 at the time of the thermal curing treatment, it is possible to remove silicone, which remains on the Au layer 42, by changing a silicone film into the silica film S1 through the surface treatment. Therefore, since it is possible to remove silicone, which causes an obstacle to wire bonding, from the Au layer 42, it is possible to improve wire bondability further than in a case in which the surface treatment is not performed.

(4) The silicone film formed on the Au layer 42 is removed by an ultraviolet treatment or an oxygen plasma treatment. Since a combustion system or the like is not required in the ultraviolet treatment or the oxygen plasma treatment as in a plasma treatment using a $CF_4$ gas as a source, it is possible to remove a silicone film at a low cost. For this reason, it is possible to contribute to the reduction in manufacturing cost.

(5) The light emitting element 81 is mounted on the insulating layer 71 having high reflectance. Accordingly, it is possible to improve the luminous efficiency of the light emitting element 81.

(6) The wiring pattern 31 is formed immediately below the insulating layer 71 on which the light emitting element 81 is mounted. Accordingly, it is possible to dissipate heat, which is generated from the light emitting element 81, to the heat dissipation plate 60 from the insulating layer 71 through the wiring pattern 31 and the insulating layer 50. Here, since the thermal conductivity of the wiring pattern 31 is higher than that of the insulating layer 50, it is possible to dissipate the heat, which is generated from the light emitting element 81, to the heat dissipation plate 60 more efficiently than in a case in which the insulating layer 71 is formed on the insulating layer 50. Accordingly, it is possible to suitably suppress the deterioration of the luminous efficiency of the light emitting element 81.

(7) The insulating layer 50 is formed so as to cover all of the side surfaces of each of the wiring patterns 30, and each of the wiring patterns 30 is supported by the insulating layer 50. Accordingly, it is possible to omit section bars, support bars, or the like that have been required to support wires (leads) in the lead frame in the related art. For this reason, when the insulating layers 50 and 70 and the heat dissipation plate 60 are cut at the positions of shown in FIG. 2 so that the wiring board 24 is divided, the side surfaces of the wiring patterns 30 (the board frame 22) are not exposed to the cut surfaces. Accordingly, it is possible to suitably suppress the oxidation of the wiring patterns 30.

In addition, in the divided wiring board 24, all of the side surfaces of the wiring patterns 30 are covered with the insulating layer 50. For this reason, it is possible to improve insulation reliability of the wiring board 24 and the light emitting device 80 using the wiring board 24.

(8) While the conductive substrate 90 is attached to the tape 92, the conductive substrate 90 is patterned so that the board frames 22 (the wiring patterns 30) are formed. For this reason, even though only the wiring patterns 30 are made to remain by etching, that is, only wiring patterns 30 are made to remain without section bars or support bars required to support wires in the lead frame in the related art, the wiring patterns 30 can be held by the tape 92. In addition, after the insulating layer 50 is formed so as to seal the wiring patterns 30 supported by the tape 92, the tape 92 is stripped. As described above, the tape 92 is stripped after the insulating layer 50 supporting the wiring patterns 30 is formed. For this reason, the wiring patterns 30 can be held (supported) at predetermined positions by the insulating layer 50 even after the tape 92 is stripped. Accordingly, it is possible to omit the section bars or the support bars that have been required to support wires in the related art.

<Modifications of First Embodiment>

The first embodiment can also be embodied in the form of the following aspects that are obtained by appropriately modifying the first embodiment.

Figure 8A:
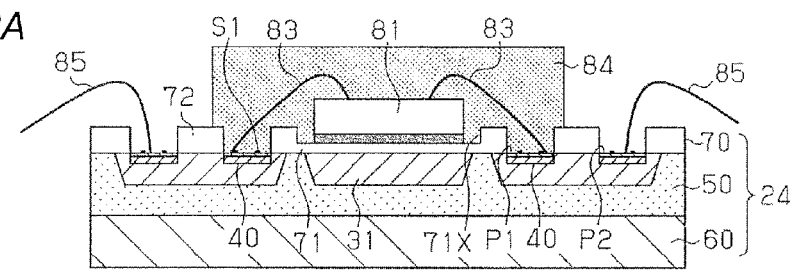
FIGS. 8A to 8D are schematic cross-sectional views of light emitting devices according to a modification of the first embodiment.

The shape of the insulating layer 71 of the first embodiment is not particularly limited. For example, as shown in FIG. 8A, a recess 71X (a third recess) may be formed on the upper surface of the insulating layer 71. The recess 71X is extended from the upper surface of the insulating layer 71 to an intermediate position of the insulating layer 71 in the thickness direction. That is, each of the recesses 71X is formed so that the bottom of the recess is positioned in the middle of the insulating layer 71 in the thickness direction. Further, the light emitting element 81 may be mounted on the bottom of the recess 71X. Accordingly, since the insulating layer 71 having high reflectance can be formed so as to surround the light emitting element 81, it is possible to improve the luminous efficiency of the light emitting device 80.

Figure 8B:
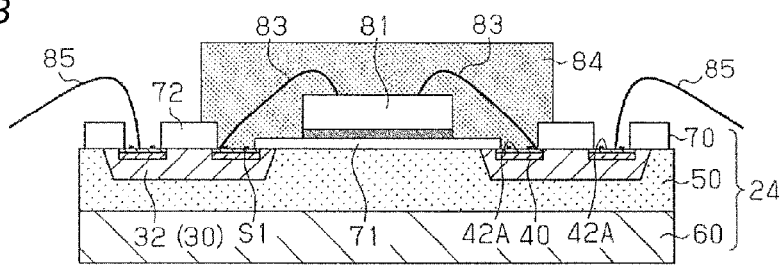

The shape of the insulating layer 70 of the first embodiment is not particularly limited. For example, the insulating layer 70 has been formed so that the entire upper surfaces 42A of the plating layers 40 are exposed to the outside in the first embodiment, but the insulating layer 70 (the insulating layers 71 and 72) may be formed so as to cover a part of the upper surfaces 42A of the plating layers 40 as shown in FIG. 8B. Further, the outer side surfaces of the insulating layer 70 (the insulating layer 72) have been formed so as to be flush with the outer side surfaces of the insulating layer 50 and the heat dissipation plate 60 in the first embodiment, but, for example, the insulating layer 70 (the insulating layer 72) may be formed so as to be recessed from the outer side surfaces of the insulating layer 50 and the heat dissipation plate 60 as shown in FIG. 8B.

As shown in FIG. 8B, the wiring pattern 31 may be omitted from the light emitting device 80 and the wiring board 24 of the first embodiment. Since the heat of the light emitting element 81 can be dissipated to the wiring patterns 30 through the insulating layer 71 in this structure, it is possible to improve the life of the luminous efficiency of the light emitting element 81.

In the first embodiment and the respective modifications, the plating layers 40 have been formed on the bottoms (first surfaces) of the recesses 32X of the wiring patterns 32. However, the present invention is not limited to the above embodiment. For example, as shown in FIG. 8C, the plating layers 40 may be formed on the upper surfaces 32A (first surfaces) of the wiring patterns 32.

In the first embodiment and the respective modifications, the light emitting element 81 has been mounted on the insulating layer 71. However, the present invention is not limited to the above embodiment. For example, as shown in FIG. 8D, the same plating layer 43 as the plating layer 40 may be formed on the wiring pattern 31 and the light emitting element 81 may be mounted on the plating layer 43. For example, the light emitting element 81 may be bonded onto the plating layer 43 by an adhesive 82.

Further, the insulating layer 71 and the plating layer 43 may be omitted and the light emitting element 81 may be mounted on the wiring pattern 31. Alternatively, the insulating layer 71 may be omitted from the wiring board 24 shown in FIG. 8B and the light emitting element 81 may be mounted on the insulating layer 50.

Figure 8C:
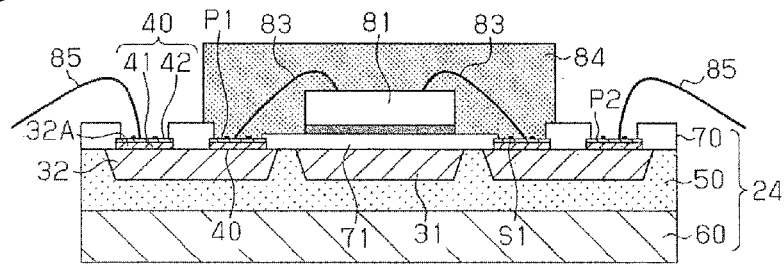
Figure 8D:
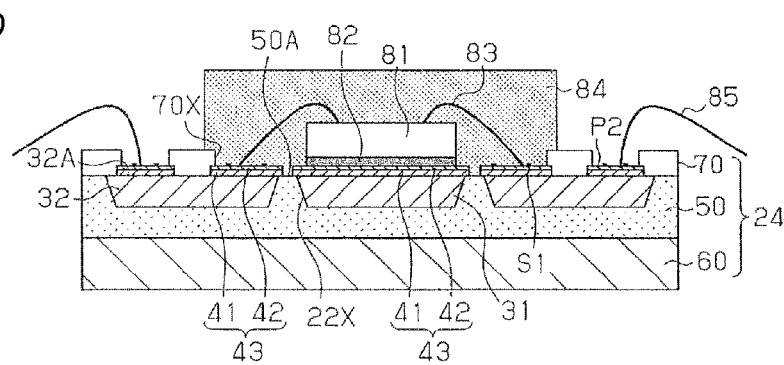

In the modification shown in FIG. 8C, the plating layer 40 has been formed on only the upper surfaces 32A of the wiring patterns 32. For example, as shown in FIG. 8D, the plating layer 40 may be formed so as to cover a part of the upper surfaces 32A of the wiring patterns 32 and so as to cover a part of the upper surface 50A of the insulating layer 50 formed between the adjacent wiring patterns 30, without being limited thereto. Further, the plating layer 43 formed on the wiring pattern 31 may be formed so as to cover the upper surface of the wiring pattern 31 and so as to cover a part of the upper surface 50A of the insulating layer 50 formed between the adjacent wiring patterns 30. Accordingly, an interval between the plating layers 40 and layer 43 can be made smaller than an interval between the wiring patterns 31 and 32.

Figure 9A:
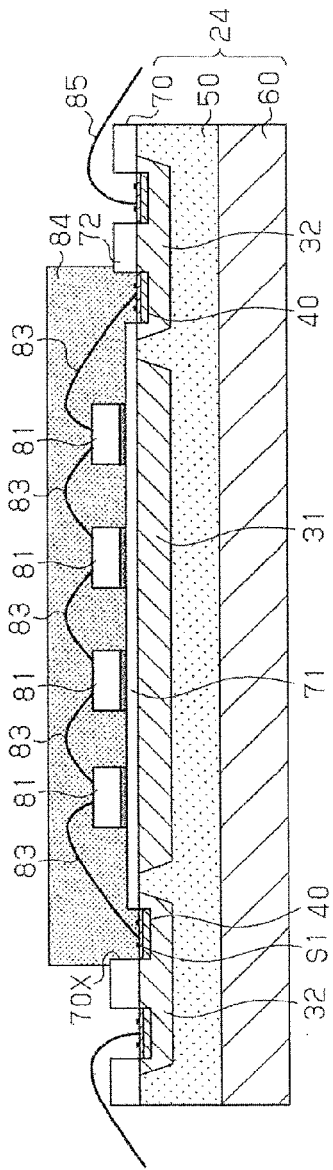
FIGS. 9A and 9B are schematic cross-sectional views of the light emitting devices according to another modification of the first embodiment.

As shown in FIG. 9A, a plurality of (four in FIG. 9A) light emitting elements 81 may be mounted on the insulating layer 71. In this modification, electrodes (not shown) of the light emitting elements 81, which are mounted on the outermost side on the insulating layer 71, are electrically connected to the plating layers 40, which are exposed to the outside through the openings 70X of the insulating layer 70, by bonding wires 83. Further, electrodes of the adjacent light emitting elements 81 are electrically connected to each other by bonding wires 83. As described above, the connection between the light emitting elements 81 mounted on the insulating layer 71 may be series connection as in this modification, may be parallel connection, and may be both series connection and parallel connection.

Figure 9B:
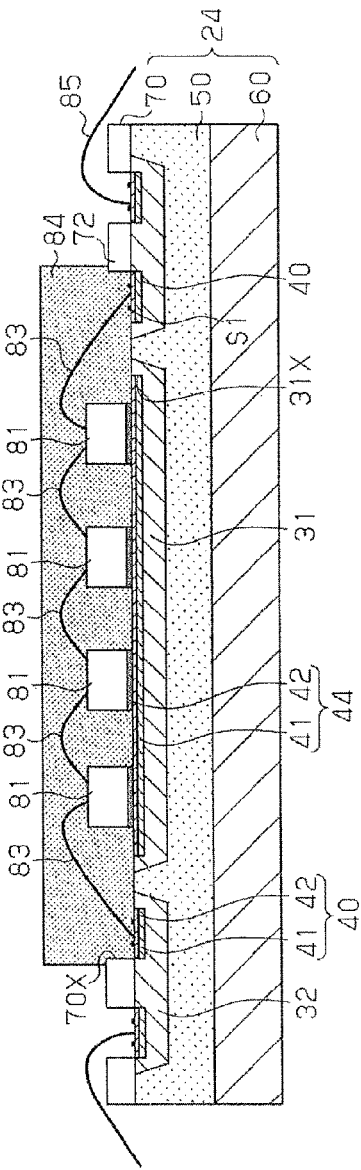

As shown in FIG. 9B, a recess 31X may be formed on the upper surface of the wiring pattern 31, the same plating layer 44 as the plating layer 40 may be formed on the bottom of the recess 31X, and the light emitting elements 81 may be mounted on the plating layer 44. That is, the light emitting elements 81 may be mounted on the plating layer 44 that is embedded in the wiring pattern 31.

In the first embodiment, the wiring boards 24 (the light emitting devices 80) have been divided after the light emitting element 81 is mounted on each of the wiring boards 24 by wire bonding. This invention is not limited to the above embodiment. For example, the light emitting element 81 may be mounted on each of the wiring boards 24 by wire bonding after the wiring boards 24 are divided. In this case, as long as the surface treatment to be performed on the upper surface 42A of the Au layer 42 is performed before the light emitting element 81 is mounted on each of the wiring boards 24, the surface treatment may be performed either before or after the division of the wiring boards 24. That is, the surface treatment to be performed on the upper surface 42A of the Au layer 42 does not need to be performed immediately before the light emitting elements 81 are mounted on the wiring boards 24.

The lead frame 21 in which the plurality of wiring boards 24 are continuously arranged in the form of a matrix has been embodied in the first embodiment, but a lead frame in which the plurality of wiring boards 24 are continuously arranged in the form of strips may be embodied. That is, as long as the plurality of wiring boards are continuously arranged in a lead frame, the arrangement of the wiring boards is not particularly limited.

The lead frame 21 of the first embodiment may be used in a surface mount type package of which a plurality of terminals for external connection are exposed to one surface of the package, such as QFN, BGA (Ball Grid Array), LGA (Land Grid Array), CSP (Chip Size Package), or SON (Small Out line Non-Lead Package).

<Second Embodiment>

A second embodiment will be described below with reference to FIGS. 10 to 15. The same members as the members shown in FIGS. 1 to 9 will be denoted by the same reference numerals, and the detailed description thereof will be omitted.

As shown in FIG. 10A, a light emitting device 100 includes a wiring board 110, a plurality of (16 in this embodiment) light emitting elements 81 that are mounted on the wiring board 110, and a sealing resin 84 that seals the light emitting elements 81 and the like.

The wiring board 110 includes a heat dissipation plate 120, an insulating layer 130 that is formed on the heat dissipation plate 120, wiring patterns 140 that are formed on the insulating layer 130, a plating layer 150 that is formed on a part of the wiring patterns 140, and an insulating layer 160 that covers a part of the wiring patterns 140 and the plating layer 150.

The heat dissipation plate 120 is, for example, a flat plate that has a substantially rectangular shape in a plan view. For example, metals, such as copper, aluminum, and iron, which are excellent in thermal conductivity, can be used as the material of the heat dissipation plate 120, similar to the case of the heat dissipation plate 60. The thickness of the heat dissipation plate 120 can be set in the range of, for example, about 200 µm to 2000 µm.

The insulating layer 130 is formed so as to cover the entire upper surface of the heat dissipation plate 120. The insulating layer 130 has a function of insulating the wiring patterns 140 from the heat dissipation plate 120 and a function of bonding the wiring patterns 140 to the heat dissipation plate 120. The insulating layer 130 is, for example, a flat plate that has a substantially rectangular shape in a plan view. For example, an insulating resin, such as a polyimide-based resin or an epoxy-based resin, or a resin material that is obtained by mixing a filler, such as silica or alumina, into an epoxy-based resin can be used as the material of the insulating layer 130. The thickness of the insulating layer 130 can be set in the range of, for example, about 25 µm to 200 µm.

Figure 12:
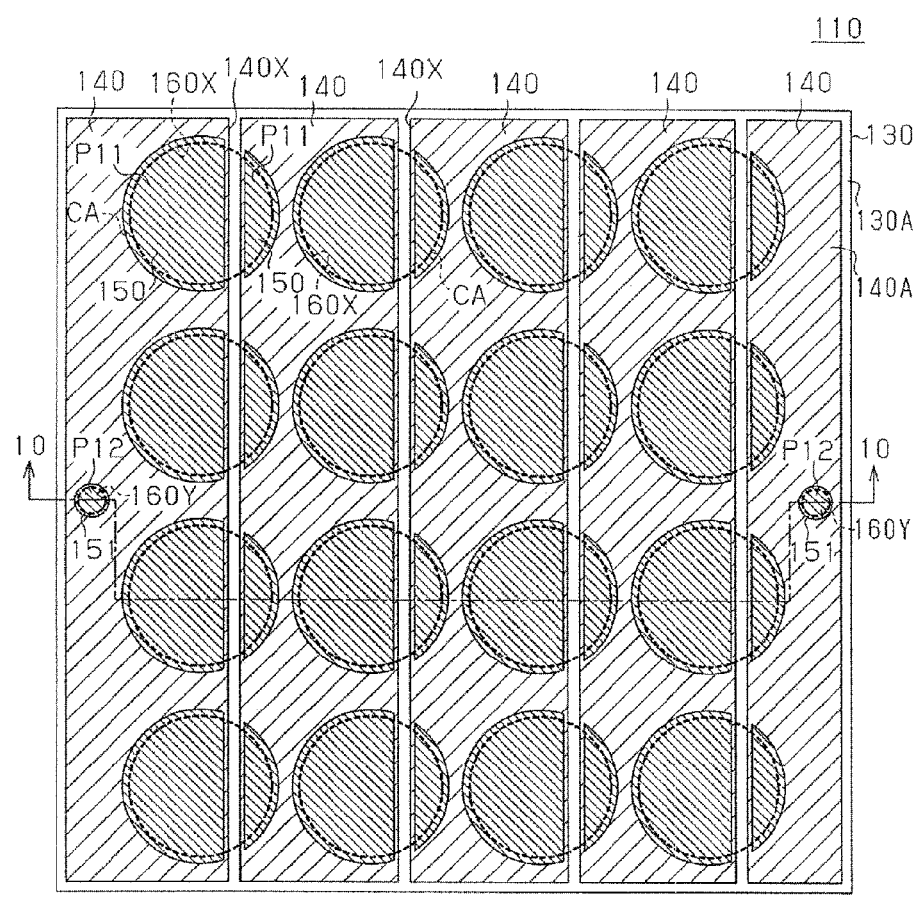
FIG. 12 is a schematic plan view of the wiring board according to the second embodiment, wherein some members (insulating layers formed on the outermost surface) are not shown.

The wiring patterns 140 are formed on an upper surface 130A (a first surface) of the insulating layer 130. As shown in FIG. 12, the wiring patterns 140 are formed so as to cover the upper surface 130A of the insulating layer 130 as a whole. Specifically, the plurality of (five in FIG. 12) wiring patterns 140, which have the shape of a strip in a plan view (a rectangular shape in a plan view), are disposed so as to be parallel and adjacent to each other. Further, a groove-shaped opening 140X through which the insulating layer 130 disposed below the wiring patterns is exposed to the outside is formed between the adjacent wiring patterns 140. Since the plurality of wiring patterns 140 are spaced apart from each other by the openings 140X, the plurality of wiring patterns 140 are electrically independent of each other. Meanwhile, for example, copper or a copper alloy can be used as the material of the wiring pattern 140. The thickness of the wiring pattern 140 can be set in the range of, for example, about 3 µm to 105 µm. The length of a long side of the wiring pattern 140 can be set in the range of, for example, about 5 µm to 10 µm, and the length of a short side of the wiring pattern 140 can be set in the range of, for example, about 1 µm to 5 µm. Further, the width of an interval between the respective wiring patterns 140 (the width of the opening 140X) can be set in the range of, for example, about 0.1 µm to 0.3 µm.

As shown in FIG. 10B, an upper surface 140A of the wiring pattern 140 is roughened and a fine uneven shape is formed on the upper surface 140A. The degree of the roughness of the roughened upper surface 140A of the wiring pattern 140 is set so that, for example, a surface roughness Ra value of the upper surface 140A is in the range of 55 nm to 200 nm. Here, the surface roughness Ra value is a kind of a value that represents surface roughness, and is called arithmetic mean roughness. Specifically, the surface roughness Ra value is a value that is an arithmetic mean of the absolute values of the heights that vary in an area to be measured and are measured from the surface as a mean line. The surface roughness Ra value is measured using, for example, an atomic force microscope.

As shown in FIG. 12, a plurality of plating layers 150, which have a substantially semicircular shape in a plan view, are formed on the upper surfaces 140A (first surfaces) of the wiring patterns 140. These plating layers 150 are formed so that linear portions of substantially semicircular shapes of a pair of plating layers 150 are formed so as to face each other with the opening 140X interposed therebetween in a plan view. That is, the pair of plating layers 150 are formed on the upper surfaces 140A of the different wiring patterns 140, and are formed so as to have a substantially circular shape in a plan view as a whole. Further, the pairs of plating layers 150 are formed on the wiring patterns 140 in the form of a matrix (4×4 in FIG. 12). Each of the plating layers 150 includes a connection pad P11 to which the light emitting element 81 (see FIG. 10A) is bonded. Meanwhile, as shown in FIG. 10A, each of the plating layers 150 is not formed on the side surfaces of the wiring patterns 140, that is, the side walls of the openings 140X and is formed so as to be recessed from edges of the wiring patterns 140 that form the side walls of the openings 140X.

As shown in FIG. 12, a pair of plating layers 151, which has a substantially circular shape in a plan view, are formed on the upper surfaces 140A of the wiring patterns 140. The plating layers 151 are formed on the upper surfaces 140A of the wiring patterns 140 that are positioned outside the plating layers 150. Specifically, the pair of plating layers 151 are formed outside the plating layers 150, which are formed on these wiring patterns 140, on two wiring patterns 140, which are disposed on the outermost side, among five wiring patterns 140. Each of the plating layers 151 includes an electrode terminal P12 to which power is supplied from the outside.

Similar to the plating layers 40, examples of these plating layers 150 and 151 may include a Ni layer/an Au layer, a Ni layer/a Pd layer/an Au layer, a Ni layer/a Pd layer/an Ag layer, and a Ni layer/a Pd layer/an Ag layer/an Au layer. Meanwhile, in this embodiment, as shown in FIG. 10A, a Ni layer 152 and an Au layer 153 are formed on the upper surface 140A of the wiring pattern 140 in this order, so that the plating layers 150 and 151 are formed. Further, the thickness of the Ni layer 152 can be set in the range of, for example, about 0.1 µm to 3 µm, and the thickness of the Au layer 153 can be set in the range of, for example, about 0.01 µm to 1 µm.

Silica ($SiO_2$) is contained in a part of an upper surface 153A of the Au layer 153 that is the outermost surface of each of the plating layers 150 and 151. That is, a silica film S1 is formed on a part of the upper surface 153A of the Au layer 153. Further, it is preferable that silicone (Si—O) not be contained in the upper surface 153A of the Au layer 153 (a silicone film not be formed on the upper surface 153A of the Au layer 153). For example, when the upper surface 153A of the Au layer 153 is analyzed by an ESCA, silicone is not detected, silica is detected, and metal (here, Au) as a material of the Au layer 153 is detected.

Figure 11:
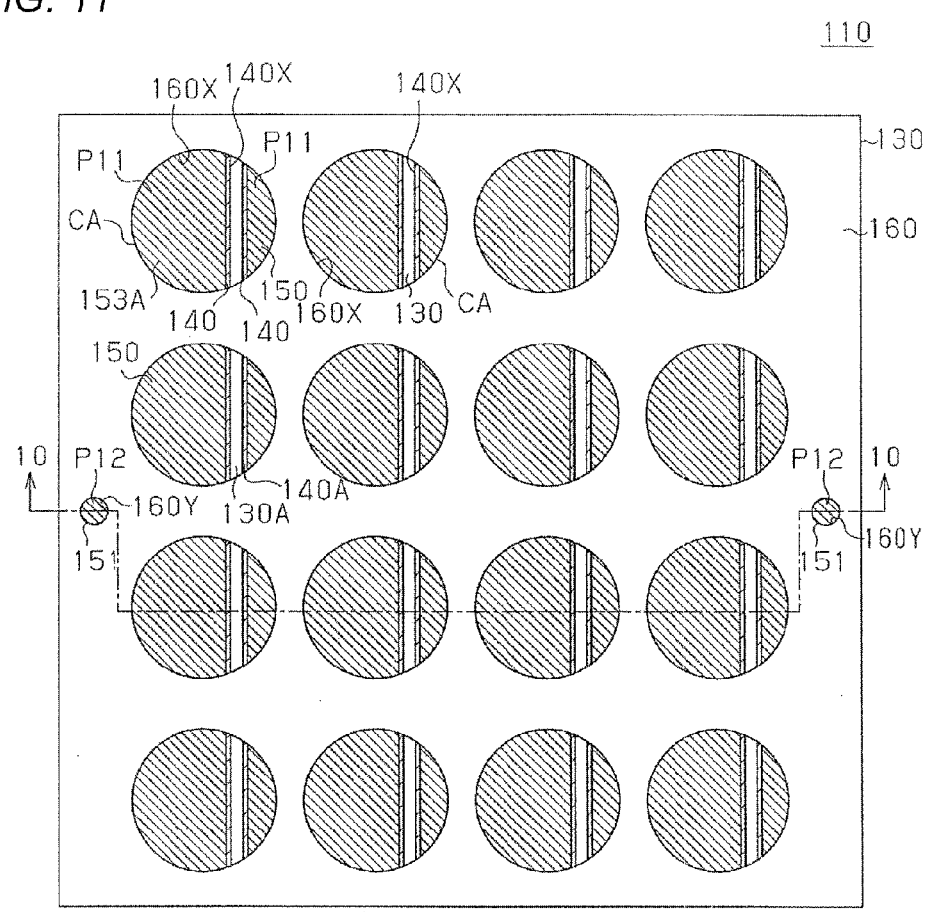
FIG. 11 is a schematic plan view of a wiring board according to a second embodiment.

The insulating layer 160 is formed so as to cover a part of the upper surfaces 140A of the wiring patterns 140, the upper surface 130A of the insulating layer 130, and the upper surfaces 153A of the plating layers 150 and 151. As shown in FIGS. 11 and 12, the insulating layer 160 includes openings 160X and openings 160Y. A part of the plating layers 150 as light emitting element-mounting areas CA on which the light emitting elements 81 are to be mounted, the wiring patterns 140, and the insulating layer 130 are exposed to the outside through the openings 160X. A part of the plating layers 151 as the electrode terminals P12 are exposed to the outside through the openings 160Y. Specifically, areas that are exposed to the outside through the openings 160X form the light emitting element-mounting area CA, and each light emitting element 81 is mounted on one plating layer 150 formed in each light emitting element-mounting area CA. Here, as shown in FIG. 11, the planar shape of each of the opening 160X and the light emitting element-mounting area CA is, for example, a circular shape. The openings 160X and the light emitting element-mounting areas CA are arranged on the wiring board 110 in the form of a matrix (4×4 in FIG. 11). In each of the light emitting element-mounting areas CA, a part of two wiring patterns 140 that are separated from each other by the groove-shaped opening 140X and a part of plating layers 150 that are formed on these wiring patterns 140 are exposed to the outside through the opening 160X. Further, in each of the light emitting element-mounting areas CA, the plating layers 150 exposed to the outside through the opening 160X function as the connection pads P11.

Furthermore, the planar shape of the opening 160Y is, for example, a substantially circular shape. Specifically, the planar shape of each of the openings 160Y is smaller than the planar shape of each of the plating layers 151. For this reason, a part of the plating layer 151 is exposed to the outside through the opening 160Y, and the plating layer 151 exposed to the outside functions as the electrode terminal P12. Power is supplied to the electrode terminal P12 from an external power source through wirings or the like of the mounting board. Meanwhile, the thickness of the insulating layer 160 between the upper surface 130A of the insulating layer 130 and the upper surface of the insulating layer 160 can be set in the range of, for example, about 50 µm to 150 µm.

A material, which is excellent in heat resistance, can be used as the material of the insulating layer 160. For example, a resin material, which contains silicone excellent in heat resistance and light resistance, can be used as the material of the insulating layer 160.

In addition, it is preferable that the insulating layer 160 have high reflectance. For example, the insulating layer 160 has a reflectance of 50% or more (preferably 80% or more) in the wavelength range of 450 nm to 700 nm. A resin material in which a pigment or a filler formed of white titanium oxide and barium sulfate is contained in a silicone-based resin can be used as the material of the insulating layer 160.

Each of the light emitting elements 81 is mounted on each of the light emitting element-mounting areas CA of the wiring board 110. Specifically, each of the light emitting elements 81 is mounted on one plating layer 150 formed in each light emitting element-mounting area CA. More specifically, as shown in FIG. 10A, each of the light emitting elements 81 is bonded onto the one plating layer 150 by an adhesive 82. Further, one electrode (not shown) of each of the light emitting elements 81 is electrically connected to the one plating layer 150 through a bonding wire 83, and the other electrode (not shown) thereof is electrically connected to the other plating layer 150, which is formed in each light emitting element-mounting area CA, through a bonding wire 83. Accordingly, each electrode of each of the light emitting elements 81 is electrically connected to the wiring pattern 140 through the bonding wire 83 and the plating layer 150. By this connection, four light emitting elements 81 are connected in series between the pair of electrode terminals P12 in the light emitting device 100 according to this embodiment and four groups of these light emitting elements 81, which are connected in series, are connected in parallel (see FIG. 12). Furthermore, power is supplied to these light emitting elements 81 from an external power source (not shown) through the mounting board, the electrode terminals P12, the wiring patterns 140, and the like, so that the light emitting elements 81 emit light.

As shown in FIG. 10A, the sealing resin 84 is provided on the upper surface of the wiring board 110 so as to seal the light emitting elements 81, the bonding wires 83, and the like. Meanwhile, the electrode terminals P12 and the periphery of the electrode terminals P12 are not sealed with the sealing resin 84.

Next, a method of manufacturing the light emitting device 100 will be described.

First, a multi-piece substrate (hereinafter, simply referred to as a "substrate") 120A is prepared for the manufacture of the wiring board 110. Although not shown, the substrate 120A includes a plurality of (for example, three) sections in which wiring board-forming areas, that is, areas in which the wiring boards 110 are formed are formed in the form of a matrix (for example, 3×3). After structures corresponding to the wiring boards 110 are formed in the wiring board-forming areas, the substrate 120A is cut along cutting lines D1 by a dicing blade or the like. Accordingly, the structures corresponding to the wiring boards 110 are divided, so that a plurality of wiring boards 110 are manufactured. At this time, the substrate 120A forms the heat dissipation plate 120, which is shown in FIG. 10, of each of the wiring boards 110. For this reason, for example, metals, such as copper, aluminum, and iron, which are excellent in thermal conductivity, can be used as the material of the substrate 120A, similar to the case of the heat dissipation plate 120. Meanwhile, for convenience of description, the structure of one wiring board-forming area will be shown in FIGS. 13 to 15 to be described below.

Figure 13A:
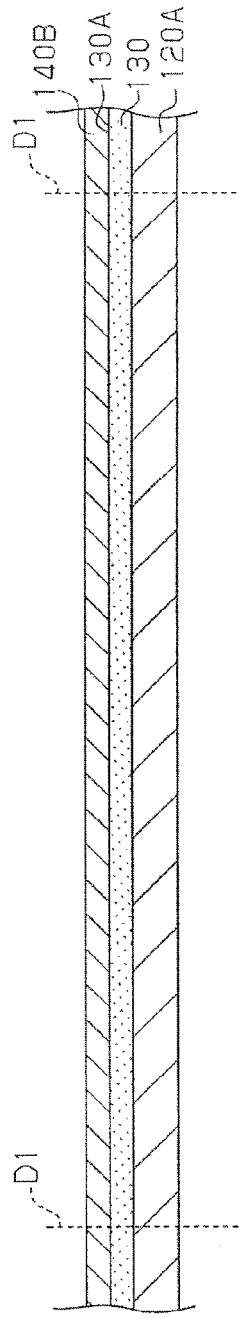
FIGS. 13A to 13C are schematic cross-sectional views illustrating a method of manufacturing the light emitting device according to the second embodiment.

Next, in a step illustrated in FIG. 13A, the insulating layer 130 is formed so as to cover the entire upper surface of the substrate 120A and a copper foil 140B is formed so as to cover the entire upper surface 130A of the insulating layer 130. For example, a one-side copper-coated substrate, which is formed by coating one surface of the insulating layer 130 with the copper foil 140B, is bonded to the substrate 120A so that the insulating layer 130 and the copper foil 140B are formed on the substrate 120A. Further, for example, an insulating resin film with a copper foil may be laminated on the substrate 120A so that the insulating layer 130 and the copper foil 140B are formed on the substrate 120A.

Furthermore, in the step illustrated in FIG. 13A, a roughening treatment is performed on the copper foil 140B. The roughening treatment is performed so that, for example, the degree of the roughness of an upper surface 140A of the copper foil 140B has a surface roughness Ra value in the range of 55 nm to 200 nm. Fine unevenness is formed on the upper surface 140A of the copper foil 140B by this roughening treatment, so that the upper surface 140A is roughened. The roughening treatment can be performed by, for example, blackening, etching, plating, blasting, and the like.

Figure 13B:
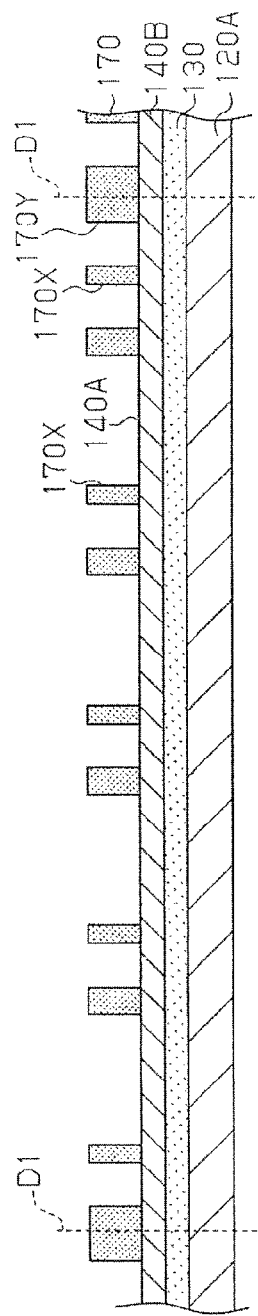

Next, in a step illustrated in FIG. 13B, a resist layer 170, which includes opening patterns 170X and 170Y at predetermined positions, is formed on the upper surface 140A of the roughened upper surface 140A. The opening patterns 170X are formed so that portions of the copper foil 140B corresponding to the plating layers 150 (see FIG. 10) formed in the light emitting element-mounting areas CA are exposed to the outside through the opening patterns 170X. Further, the opening patterns 170Y are formed so that portions of the copper foil 140B corresponding to the plating layers 151 (see FIG. 10) forming the electrode terminals P2 are exposed to the outside through a part of the opening patterns 170Y. A material having plating resistance can be used as the material of the resist layer 170, and, for example, the same material as the material of the resist layer 91 can be used as the material of the resist layer 170. Furthermore, the resist layer 170 can be formed by the same method as the method of forming the resist layer 91.

Figure 13C:
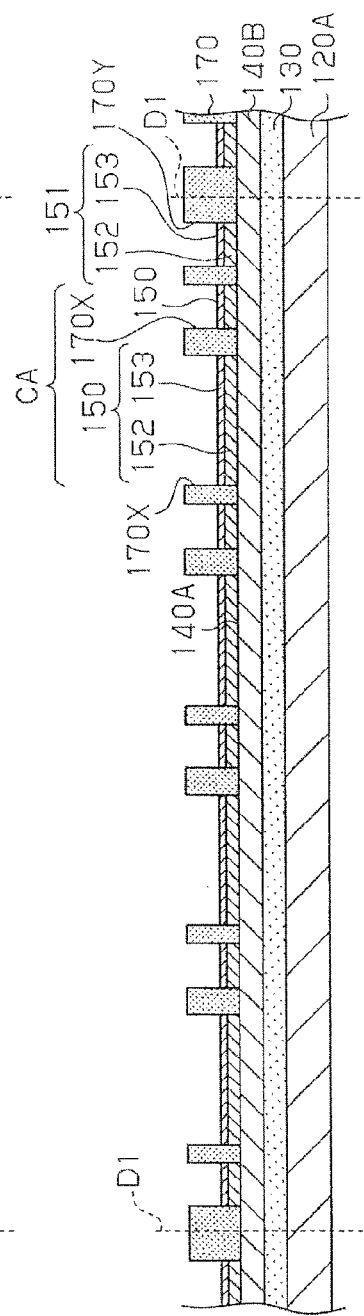

Subsequently, in a step illustrated in FIG. 13C, an electrolytic plating method, which uses the copper foil 140B as a plating-power supply layer, is performed on the upper surface 140A of the copper foil 140B while the resist layer 170 is used as a plating mask. Specifically, electrolytic plating is performed on the upper surface 140A of the copper foil 140B, which is exposed to the outside through the opening patterns 170X of the resist layer 170, to form the plating layers 150 on the portions of the copper foil 140B corresponding to the light emitting element-mounting areas CA. Further, electrolytic plating is performed on the upper surface of the copper foil 140B, which is exposed to the outside through the opening patterns 170Y of the resist layer 170, to form the plating layers 151 on the copper foil 140B. Here, if each of the plating layers 150 and 151 has a structure in which a Ni layer 152 and an Au layer 153 are formed, the Ni layer 152 and the Au layer 153 are sequentially formed on the upper surface of the copper foil 140B, which is exposed to the outside through the opening patterns 170X and 170Y of the resist layer 170, by an electrolytic plating method. After that, the resist layer 170 is removed by, for example, an alkaline stripping solution.

Next, in a step illustrated in FIG. 14A, a resist layer 171, which includes openings 171X at predetermined positions, is formed on the upper surface 140A of the copper foil 140B. The resist layer 171 is formed so as to cover portions of the copper foil 140B that correspond to certains wiring patterns 140. In other words, the resist layer 171 includes the openings 171X that are formed at positions corresponding to the openings 140X. A material having etching resistance can be used as the material of the resist layer 171, and, for example, the same material as the material of the resist layer 91 can be used as the material of the resist layer 171. Further, the resist layer 171 can be formed by the same method as the method of forming the resist layer 91.

Subsequently, while the resist layer 171 is used as an etching mask, the copper foil 140B is etched so that the copper foil 140B is patterned in a predetermined shape. Accordingly, the openings 140X are formed in the copper foil 140B, so that the certain wiring patterns 140 are formed on the upper surface 130A of the insulating layer 130. At this time, the plating layers 150 and 151 are formed so as to be recessed from the edges of the wiring patterns 140 that form the side walls of the openings 140X. After that, the resist layer 171 is removed by, for example, an alkaline stripping solution.

Nest, in a step illustrated in FIG. 14B, the insulating layer 160, which includes the openings 160X and 160Y corresponding to the light emitting element-mounting areas CA and the electrode terminals P12, is formed on the insulating layer 130, the wiring patterns 140, and the plating layers 150 and 151. Specifically, the insulating layer 160, through which a part of the upper surfaces of the plating layers 150 are exposed to the outside as the connection pads P11 and a part of the plating layers 151 are exposed to the outside as the electrode terminals P12, is formed on the insulating layer 130 and the wiring patterns 140. The insulating layer 160 can be formed by, for example, a screen printing method using resin paste.

Subsequently, the insulating layer 160 is cured by curing (a thermal curing treatment) at an atmospheric temperature of about 150° C. At this time, low-molecular silicone (Si—O) is volatilized from the insulating layer 160 and the volatilized silicone adheres to the upper surfaces 153A of the plating layers 150 and 151. Accordingly, a silicone film is formed on a part of the upper surfaces 153A of the plating layers 150 and 151.

After that, in a step illustrated in FIG. 14C, a surface treatment using oxygen active species is performed on the structure shown in FIG. 14B. For example, an ultraviolet treatment or an oxygen plasma treatment can be used as the surface treatment. In the embodiment of FIG. 14C, similar to the step illustrated in FIG. 7A, the upper surface (at least the upper surfaces 153A of the plating layers 150 and 151) of the structure shown in FIG. 14B is irradiated with ultraviolet light L. It is possible to change the silicone film, which is formed on the upper surfaces 153A of the plating layers 150 and 151 by the thermal curing treatment, into the silica film S1 by this surface treatment.

Next, in a step illustrated in FIG. 15A, portions of the insulating layer 160, the insulating layer 130, and the substrate 120A, which correspond to the cutting lines D1 shown in FIG. 14C, are cut by a dicing blade or the like. Accordingly, the wiring board 110 according to this embodiment is manufactured. Meanwhile, at this time, the substrate 120A forms the heat dissipation plate 120.

Subsequently, in a step illustrated in FIG. 15B, the light emitting element 81 is mounted on each of the light emitting element-mounting areas CA of the wiring board 110 by wire bonding. In detail, first, the light emitting element 81 is mounted on one plating layer 150, which is formed in each light emitting element-mounting area CA, by an adhesive 82. Subsequently, electrodes (not shown) of the light emitting elements 81 are connected to the plating layers 150 (that is, the connection pads P11), which are exposed to the outside through the openings 160X of the insulating layer 160, by the bonding wires 83, and the light emitting elements 81 are electrically connected to the wiring patterns 140. Specifically, one electrode of the light emitting element 81 is electrically connected to one connection pad P11 by the bonding wire 83, and the other electrode of the light emitting element 81 is electrically connected to the other connection pad P11 by the bonding wire 83. Since a silicone film is not formed on the plating layer 150 and a silica film 51 has been formed instead of a silicone film at this time, it is possible to bond the plating layers 150 to the bonding wires 83 well.

Next, the sealing resin 84, which seals the plurality of light emitting elements 81 mounted on the wiring board 110 by wire bonding and the bonding wires 83, is formed in a step illustrated in FIG. 15C.

The light emitting device 100 according to this embodiment is manufactured by the above-mentioned manufacturing steps. Meanwhile, when the light emitting device 100 is mounted on a mounting board (not shown), the wires 85 for external connection are connected to the plating layers 151 exposed to the outside through the openings 160Y of the insulating layer 160, that is, the electrode terminals P12.

According to the above-mentioned second embodiment, the same effects as the effects (1) to (4) of the first embodiment are obtained.

<Experimental Results>

Here, experimental results proving that a silicone film formed on the plating layer is changed into a silica film by a surface treatment using oxygen active species as described above and wire bondability is improved by the change of a silicone film into a silica film as described above will be described with reference to FIGS. 16 and 17.

Figures 16, 17:
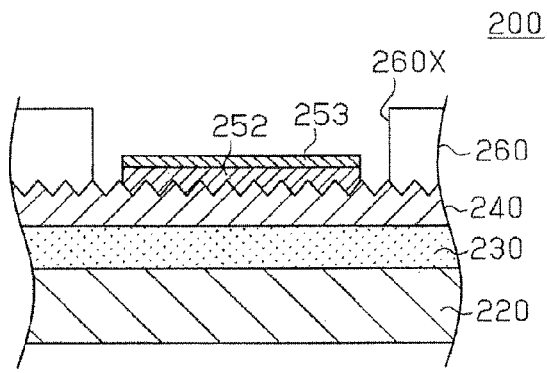
FIG. 16 is a schematic cross-sectional view showing the structure of a sample that was used in an experiment.
FIG. 17 is a table showing the analysis results obtained by an ESCA and the measured results of wire bonding strength.

First, a structure 200 shown in FIG. 16 is manufactured by the same method as the method according to the embodiment. In detail, an insulating layer 230 having a thickness of 0.1 mm was formed on the upper surface of a substrate 220 that has a thickness of 1 mm and is made of aluminum, and a copper foil 240 having a thickness of 0.1 mm was formed on the upper surface of the insulating layer 230. Subsequently, after a roughening treatment was performed on the copper foil 240, a Ni layer 252 and an Au layer 253 were sequentially formed on the copper foil 240 by an electrolytic plating method. At this time, the thickness of the Ni layer 252 was 1.0 µm and the thickness of the Au layer 253 was 0.1 µm. After that, the copper foil 240 was patterned in a predetermined shape to form an insulating layer 260, which covers a part of the copper foil 240 and has openings 260X through which the entire upper surface of the Au layer 253 is exposed to the outside, on the insulating layer 230. The insulating layer 260 was cured by curing at an atmospheric temperature of about 150° C. The material of the insulating layer 260 was a resin material containing a silicone-based resin and a filler formed of white titanium oxide contained in the silicone-based resin. Further, the thickness between the upper surface of the insulating layer 230 and the upper surface of the insulating layer 260 was 120 µm.

Next, an ultraviolet treatment was performed on the structure 200. In the ultraviolet treatment, the oxygen concentration in a treatment chamber in which the structure 200 as an object to be treated was to be placed was set to 5% and the upper surface of the structure 200 was irradiated with ultraviolet light (excimer UV light) having a wavelength of 172 nm. The irradiation amount of excimer UV light at this time was changed to 0.0 mJ/cm$^2$ (Sample 1), 520 mJ/cm$^2$ (Sample 2), 1300 mJ/cm$^2$ (Sample 3), 2340 mJ/cm$^2$ (Sample 4), and 3900 mJ/cm$^2$ (Sample 5) to produce five kinds of samples. Furthermore, the surface state of the Au layer 253 of each of Samples 1 to 5 was analyzed by an ESCA (an X-ray photoelectron spectrometer). The analysis results of relative atomic weight obtained by the ESCA were shown in FIG. 17. According to the analysis condition of the ESCA, a Quantera SXM manufactured by ULVAC-PHI was used as a device, AlKα (monochromator) was used as an X-ray source, a photoelectron ejection angle was set to 45°, an area to be measured was set to an area having a diameter of about 100 µm, and an electrical charge neutralizing mechanism was used. Meanwhile, Sample 1, which was obtained when the irradiation amount of excimer UV light was 0.0 mJ/cm$^2$, was a sample obtained when an ultraviolet treatment was not performed on the structure 200.

Subsequently, the first bonding and the second bonding of an Au wire were performed on each of the Au layers 253 of Samples 1 to 5, and the tensile strength (the wire bonding strength) of the Au wire was measured. The results of the measurement of the tensile strength of the Au wire are shown in FIG. 17 in association with ESCA analysis results.

Here, the tensile strength is a value representing a load obtained when the tension test of an Au wire stitch-bonded portion of each of Samples 1 to 5 in which stitch bonding was performed on the Au layer 253 was performed and the Au wire was separated or broken in the tension test. A larger load means that tensile strength (wire bonding strength) is higher and connection reliability of the Au wire is higher.

As apparent from the results of FIG. 17, the amount of silicone (Si—O) contained in the upper surface of the Au layer 253 is reduced and the amount of silica (SiO$_2$) is increased with the increase of the irradiation amount of excimer UV light. The reason for this is considered that the oxygen active species generated by the excimer UV light react with a silicone film formed on the Au layer 253 and a SiO$_2$ film is formed by the irradiation of the Au layer 253 with excimer UV light as described above. In addition, since the amount of the oxygen active species generated by the excimer UV light is increased with the increase of the irradiation amount of excimer UV light, it is considered that a large amount of silicone formed on the Au layer 253 is changed and as large of an amount of silica is generated. Further, in the experimental results, silicone could not be detected from the upper surface of the Au layer 253 in the ESCA analysis when the irradiation amount of excimer UV light became 2340 mJ/cm$^2$ or greater (Samples 4 and 5).

Further, as is apparent from the comparison between Sample 1 and Samples 2 to 5, when an ultraviolet treatment is performed on the Au layer 253 before wire bonding (Samples 2 to 5), it was possible to improve wire bonding strength further than in a case in which an ultraviolet treatment is not performed on the Au layer 253 (Sample 1). Furthermore, it was found from the results of Samples 2 to 5 that the wire bonding strength was increased with the increase of the irradiation amount of excimer UV light. Moreover, in Samples 4 and 5 in which silicone could not be detected, it was possible to obtain the wire bonding strength 1.7 times as great as the wire bonding strength that was obtained from Sample 1 in which an ultraviolet treatment was not performed. Accordingly, it was possible to obtain practically sufficient wire bonding strength. It is considered that this improvement of wire bonding strength is caused by the reduction of the amount of silicone present on the above-mentioned Au layer 253.

From the above description, it is possible to change the silicone film into a silica film by performing an ultraviolet treatment on the Au layer 253 even when a silicone film is formed on the Au layer 253 with a thermal curing treatment of the insulating layer 260. Accordingly, it is possible to further suppress the deterioration of wire bondability. That is, when an ultraviolet treatment is performed on the Au layer 253, it is possible to improve wire bondability further than in a case in which an ultraviolet treatment is not performed on the Au layer 253. At this time, it is preferable that the irradiation amount of excimer UV light be set to the irradiation amount of excimer UV light where silicone cannot be detected from the upper surface of the Au layer 253 in the ESCA analysis, in terms of the improvement of wire bondability.

<Other Embodiments>

Meanwhile, each of the above-mentioned embodiments can also be embodied in the form of the following aspects that are obtained by appropriately modifying each embodiment.

In the second embodiment, the light emitting elements 81 have been mounted on the wiring board 110 by wire bonding after the division of the wiring boards 110. The present invention is not limited to the above embodiment. For example, the light emitting element 81 may be mounted on each of the light emitting element-mounting areas CA before the division of the wiring boards 110 and each of the light emitting devices then may be obtained by cutting the insulating layers and the heat dissipation plate along the cutting lines D1.

The second embodiment has been applied to a method of manufacturing a multi-piece board, but may be applied to a method of manufacturing a single-piece (one-piece) board.

The planar shape of each of the wiring patterns 31 and 32, the recesses 32X, and the plating layers 40 is not limited to a rectangular shape, and may be, for example, a triangular shape, a polygonal shape having five or more sides, or a circular shape.

The planar shape of each of the openings 70X and 70Y of the insulating layer 70 of the first embodiment is not limited to a rectangular shape, and may be, for example, a triangular shape, a polygonal shape having five or more sides, or a circular shape.

The planar shape of each of the plating layers 150 and 151 of the second embodiment is not limited to a semicircular shape or a circular shape, and may be, for example, a polygonal shape such as a rectangular shape or a pentagonal shape, an elliptical shape, or a semi-elliptical shape.

The planar shape of the wiring pattern 140 of the second embodiment is not particularly limited. The planar shape of each of the openings 160X and 160Y of the insulating layer 160 of the second embodiment is not limited to a circular shape, and may be, for example, a polygonal shape such as a rectangular shape or a pentagonal shape, an elliptical shape, or a semi-elliptical shape.

The planar shape of each of the wiring boards 24 and 110 and the light emitting devices 80 and 100 of the respective embodiments is not limited to a rectangular shape, and may be, for example, a triangular shape, a polygonal shape having five or more sides, or a circular shape.

For example, instead of the light emitting element 81, a light emitting element sub-mount may be mounted on each of the wiring boards 24 and 110 of the respective embodiments by wire bonding. Meanwhile, the light emitting element sub-mount has a structure in which a light emitting element is mounted on a sub-mount substrate made of, for example, ceramic or the like, reflective plates are disposed around the light emitting element, and the light emitting element is sealed with a sealing resin.

Various aspects of the subject matter described herein are set out non-exhaustively in the following numbered clauses:

1. A method of manufacturing a wiring board, the wiring board comprising a first insulating layer, a plurality of wiring patterns on the first insulating layer, and a plating layer on at least one of the wiring patterns, the method comprising:

(a) forming the plating layer by an electrolytic plating method;

(b) forming a second insulating layer on the first insulating layer and the wiring patterns, wherein the second insulating layer contains silicone therein and has an opening, wherein an outermost surface of the plating layer is exposed from the opening and serves as a connection pad; and (c) providing oxygen active species on the outermost surface of the plating layer which is exposed from the opening.

2. The method according to clause 1, wherein the oxygen active species are generated by irradiating an oxygen gas with ultraviolet light or generated by an oxygen gas plasma.

3. A method of manufacturing a light emitting device, the light emitting device comprising a wiring board and a light emitting element mounted on the wiring board, the wiring board comprising a first insulating layer, a plurality of wiring patterns on a the first insulating layer, and a plating layer on at least one of the wiring patterns, the method comprising:

(a) forming the plating layer by an electrolytic plating method;

(b) forming a second insulating layer on the first insulating layer and the wiring patterns, wherein the second insulating layer contains silicone therein and has an opening, wherein an outermost surface of the plating layer is exposed from the opening and serves as a connection pad; and (c) providing oxygen active species on the outermost surface of the plating layer which is exposed from the opening, thereby removing the silicone from the outermost surface of the plating layer;

(d) mounting the light emitting element on the wiring board after step (c); and (e) electrically connecting the light emitting element to the plating layer by a bonding wire.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A wiring board comprising:
a first insulating layer;
a plurality of wiring patterns on the first insulating layer so as to be spaced apart from each other;
a plating layer on at least one of the wiring patterns;
a second insulating layer containing silicone therein and having an opening, wherein an outermost surface of the plating layer is exposed from the opening and serves as a connection pad; and
a silica film on the outermost surface of the plating layer.

2. The wiring board according to claim 1, wherein
the first insulating layer has a first recess that is recessed relative to an upper surface of the first insulating layer,
the wiring patterns are formed on a bottom surface of the first recess, and
upper surfaces of the wiring patterns are substantially flush with the upper surface of the first insulating layer.

3. The wiring board according to claim 2, wherein
the at least one of the wiring patterns has a second recess that is recessed relative to the upper surface of the at least one of the wiring patterns,
the plating layer is formed on a bottom surface of the second recess, and
an upper surface of the plating layer is substantially flush with the upper surface of the at least one of the wiring patterns.

4. The wiring board according to claim 1, wherein a reflectance of the second insulating layer is 50% or more in a wavelength range of 450 nm to 700 nm.

5. A light emitting device comprising:
the wiring board according to claim 1; and
a light emitting element mounted on the wiring board and electrically connected to the plating layer via a bonding wire.

6. The light emitting device according to claim 5, wherein
the plurality of wiring patterns comprise a first wiring pattern and a second wiring pattern spaced apart from the first wiring pattern,
the second insulating layer is formed to cover an upper surface of the second wiring pattern, and
the light emitting element is mounted on the second insulating layer.

7. The light emitting device according to claim 5, wherein
the second insulating layer has a third recess that is recessed relative to an upper surface of the second insulating layer, and
the light emitting element is mounted on a bottom surface of the third recess.

8. The light emitting device according to claim 5, wherein
the plurality of wiring patterns comprise a first wiring pattern and a second wiring pattern spaced apart from the first wiring pattern,
another plating layer is formed on an upper surface of the second wiring pattern, and
the light emitting element is mounted on the another plating layer.

* * * * *